US006758538B2

(12) United States Patent
Fujita et al.

(10) Patent No.: US 6,758,538 B2
(45) Date of Patent: Jul. 6, 2004

(54) LUMINESCENT DISPLAY DEVICE OF ACTIVE MATRIX DRIVE TYPE AND FABRICATION METHOD THEREFOR

(75) Inventors: Yoshimasa Fujita, Kashihara (JP); Kazuo Ban, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 200 days.

(21) Appl. No.: 09/907,738

(22) Filed: Jul. 19, 2001

(65) Prior Publication Data

US 2002/0038998 A1 Apr. 4, 2002

(30) Foreign Application Priority Data

Sep. 29, 2000 (JP) ........................................ 2000-298823

(51) Int. Cl.[7] .............................................. H05B 33/00
(52) U.S. Cl. ........................ 313/506; 313/499; 428/917
(58) Field of Search ................................ 313/498–500, 313/503–506, 509; 257/79, 83; 428/917

(56) References Cited

U.S. PATENT DOCUMENTS

| 6,072,450 A | * | 6/2000 | Yamada et al. ................ 345/76 |
| 6,246,179 B1 | * | 6/2001 | Yamada .................... 315/169.3 |
| 6,281,552 B1 | * | 8/2001 | Kawasaki et al. ........... 257/350 |

FOREIGN PATENT DOCUMENTS

| JP | 2-37385 | 2/1990 |
| JP | 7-111341 | 4/1995 |
| JP | 7-122360 | 5/1995 |
| JP | 7-122361 | 5/1995 |
| JP | 7-153576 | 6/1995 |
| JP | 8-227276 | 9/1996 |
| JP | 8-241047 | 9/1996 |
| JP | 10-189252 | 7/1998 |
| JP | 11-260549 | 9/1999 |
| JP | 2000-172199 | 6/2000 |
| JP | 2000-223279 | 8/2000 |

OTHER PUBLICATIONS

"Important Issues and Commercialization Strategy for Organic EL Device", The Japanese Research Association for Organic Electronics Materials, Bunshin Publishing Co., Tokyo, Japan; Jul. 1999, pp. 55–61.
"Important Issues and Commercialization Strategy for Organic EL Device"; The Japanese Research Association for Organic Electronics Materials, Bunshin Publishing Co., Tokyo, Japan; Jul. 1999, pp. 62–69.
Dawson et al., "The Impact of the Transient Response of Organic Light Emitting Diodes on the Design of Active Matrix OLED Displays", IEDM, 1998, pp. 875–878.
Dawson et al, "4.2: Design of an Improved Pixel for a Polysilicon Active–Matrix Organic LED Display", SID 98 Digest, 1998, pp. 11–14.

* cited by examiner

Primary Examiner—Ashok Patel
(74) Attorney, Agent, or Firm—Nixon & Vanderhye P.C.

(57) ABSTRACT

A luminescent display device of active matrix drive type comprises: a substrate; a switching thin film transistor, a current control thin film transistor, a capacitor, a signal line, a scanning line and a common line which are provided on the substrate; an electroluminescent device provided on the substrate and comprising a pixel electrode connected to the common line via the current control thin film transistor, an electroluminescent layer having at least one light emitting layer, and a counter electrode; and a light-shielding layer for preventing light emitted from the electroluminescent device from reaching the switching thin film transistor and the current control thin film transistor.

23 Claims, 32 Drawing Sheets

B-B'

A-A'

LUMINESCENT DISPLAY DEVICE OF ACTIVE MATRIX DRIVE TYPE AND FABRICATION METHOD THEREFOR

CROSS-REFERENCE TO RELATED APPLICATION

This application is related to Japanese application No. 2000-298823 filed on Sep. 29, 2000, whose priority is claimed under 35 USC § 119, the disclosure of which is incorporated by reference in its entirety.

BACKGROUND OF THE INVENTION

1. Field of the Invention

The present invention relates to a luminescent display device of active matrix drive type and a fabrication method therefor. More specifically, the invention relates to a luminescent display device of active matrix drive type employing thin film transistors and to a fabrication method therefor.

2. Description of the Related Art

In the recent advanced information age, flat panel display devices have increasingly been demanded.

Hitherto known as display devices of this type are non-luminescent display devices including liquid crystal displays (LCDs), and luminescent display devices including plasma display panels (PDPs) and electroluminescent displays (ELs) such as inorganic electroluminescent displays (IOELs) and organic electroluminescent displays (OELs). Among these display devices, the organic EL devices have shown a remarkable improvement.

A known technique for displaying a motion picture on such an organic EL display device is based on simple matrix driving (for example, Japanese Unexamined Patent Publication No. Hei 2(1990)-37385, and "Important Issues and Commercialization Strategy for Organic EL Device" p.55).

In the aforesaid driving method, scanning lines are sequentially driven. For driving a greater number of scanning lines (e.g., several hundreds scanning lines), an instantaneous luminance of several hundred thousands to several millions $cd/m^2$ is required, and the driving method encounters the following problems.

(1) A higher driving voltage is required, so that interconnections suffer from a greater voltage drop.

(2) The driving is required in a lower luminous efficiency area in a higher luminance region, so that power consumption is increased.

To solve these problems, organic EL display devices have been developed which employ thin film transistors for active matrix driving (for example, Japanese Unexamined Patent Publications No. Hei 7(1995)-122360, No. Hei 7(1995)-122361, No. Hei 7(1995)-153576, No. Hei 8(1996)-241047 and No. Hei 8(1996)-227276, "Important Issues and Commercialization Strategy for Organic EL Device" p.62, IEDM98 p.875).

The organic EL display devices employing the active matrix driving method can be driven at a lower voltage. Since the driving in the higher luminous efficiency area is possible, the power consumption can significantly be reduced. Thus, the active matrix organic EL display devices are superior to the simple matrix organic EL display devices.

However, the organic EL display devices employ two or more thin film transistors for driving each pixel and, therefore, have a significantly reduced aperture ratio as compared with liquid crystal display devices (Japanese Unexamined Patent Publication No. Hei 7(1995)-111341, SID98 p.11).

To increase the pixel aperture ratio, as shown in FIGS. 27 to 29 or FIGS. 30 to 32, there has been proposed a display structure such that an organic EL device 8 including a pixel electrode 5, an EL layer 6 and a counter electrode 7 overlies a current control thin film transistor 212 or a switching thin film transistor 211 and a current control thin film transistor 212 with the intervention of an insulating film 12, and light emitted therefrom is outputted from an opposite side of a substrate 1 (for example, Japanese Unexamined Patent Publication No. 10-189252(1998)).

Where the electroluminescent device 8 which may be an inorganic EL device or an organic EL device is employed in combination with the thin film transistors as shown in FIGS. 27 to 29 and FIGS. 30 to 32, semiconductor layers 9 such as of amorphous silicon or polysilicon employed as active layers of the thin film transistors are liable to suffer from alteration or degradation in properties because of their photosensitivity when light emitted from the EL device 8 is incident on the semiconductor layers 9. This results in an increased leak current (off current). When a leak current in the switching thin film transistor is increased, charges accumulated in a capacitor are discharged through the switching thin film transistor. This makes it impossible to maintain light emission in a pixel for a proper time period, resulting in alteration in image quality. When a leak current in the current control thin film transistor is increased, a current continuously flows in the EL device, so that the EL device keeps emitting light even after the pixel is turned off, resulting in cross-talk. Further, the EL device consumes power even without light emission, resulting in an increased power consumption.

SUMMARY OF THE INVENTION

In view of the foregoing, the present invention is directed to a luminescent display device of active matrix drive type which is free from photo-degradation of active layers of thin film transistors and, hence, free from deterioration in characteristics of the thin film transistors thereby to have improved properties. The invention is further directed to a method for fabricating such a luminous display device.

In accordance with one aspect of the present invention, there is provided a luminescent display device of active matrix drive type, which comprises: a substrate; a switching thin film transistor, a current control thin film transistor, a capacitor, a signal line, a scanning line and a common line which are provided on the substrate; an electroluminescent device provided on the substrate and comprising a pixel electrode connected to the common line via the current control thin film transistor, an electroluminescent layer having at least one light emitting layer, and a counter electrode; and a light-shielding layer for preventing light emitted from the electroluminescent device from reaching the switching thin film transistor and the current control thin film transistor.

In accordance with another aspect of the present invention, there is provided a method for fabricating the aforesaid luminescent display device of active matrix drive type, wherein the at least one light emitting layer of the electroluminescent layer is formed by an evaporation method, a laser transfer method or a printing method.

DETAILED DESCRIPTION OF THE INVENTION

Figure 1:
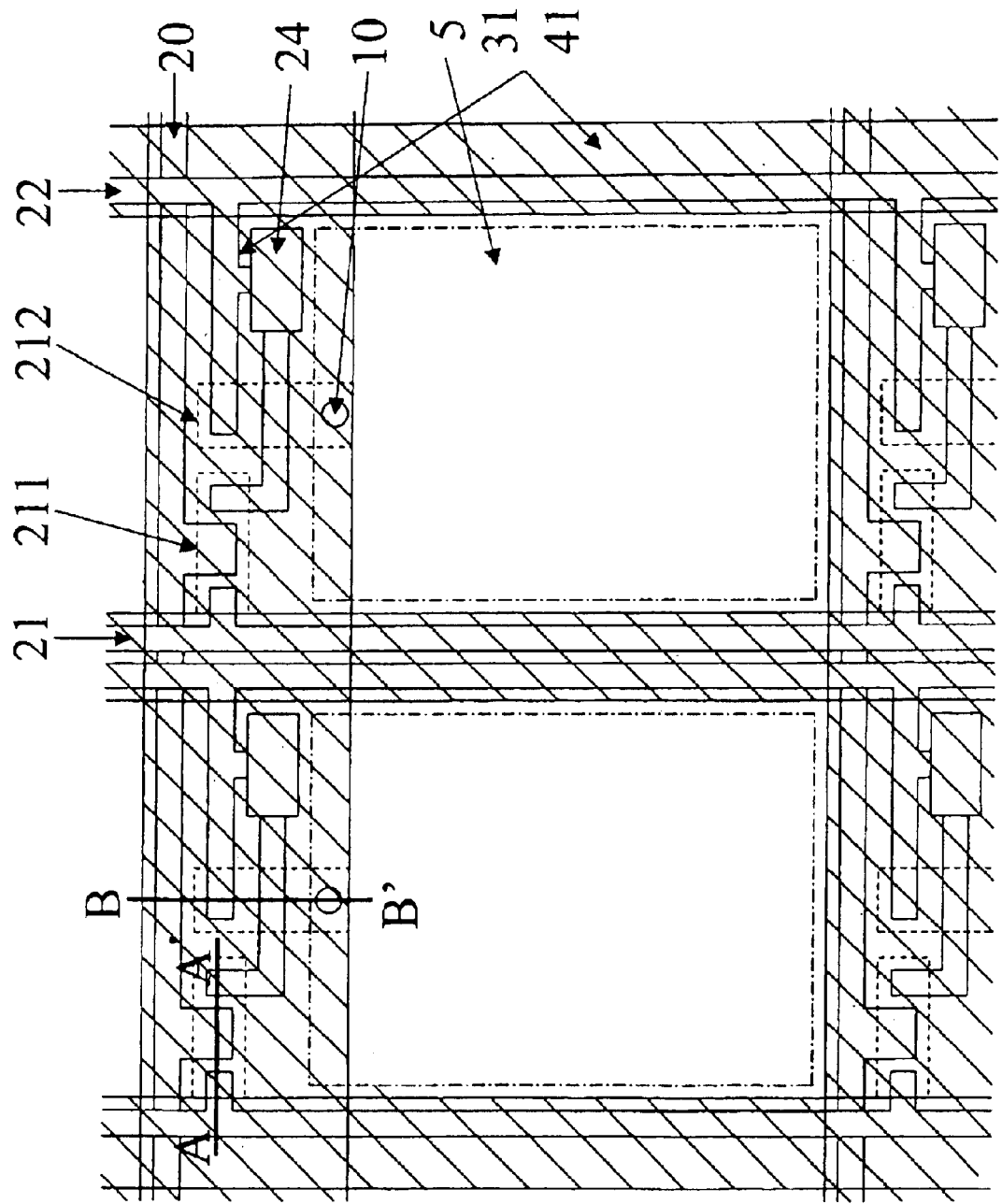
FIG. 1 is a schematic plan view illustrating a luminescent display device of active matrix drive type according to Embodiment 1 of the present invention.

A luminescent display device of active matrix drive type according to the present invention essentially includes a switching thin film transistor, a current control thin film transistor, a capacitor, a signal line, a scanning line, a common line and an EL device provided on a substrate, and a light-shielding layer for preventing light emitted from the EL device from reaching the switching thin film transistor and the current control thin film transistor.

The substrate to be used for the inventive display device is not particularly limited, but examples thereof include: insulating substrates formed of an inorganic material such as glass or quartz, a plastic material such as polyethylene terephthalate, and a ceramic material such as alumina; metal substrates such as of aluminum or iron coated with an insulation material such as $SiO_2$ or an organic insulation material; and metal substrates such as of aluminum having a surface subjected to an insulating treatment such as anodic oxidation. The substrate may be transparent, translucent, opaque or light-proof.

Where the thin film transistor is to be produced by employing polysilicon formed through a low temperature process, the substrate is preferably unmeltable and free from distortion at temperatures not higher than 500° C. Where the thin film transistor is to be produced by employing polysilicon formed through a high temperature process, the substrate is preferably unmeltable and free from distortion at temperatures not higher than 1000° C.

Where light emitted from the EL devices is to be outputted from a side of the inventive display device opposite from the substrate, the substrate may be a light-proof substrate having a light-shielding property. Examples of the light-proof substrate include ceramic substrates such as of alumina, metal substrates coated with an insulation material, metal substrates having a surface subjected to an insulating treatment such as oxidation, and transparent substrates such as of glass, quartz or plastic coated with a light-shielding insulation material. These substrates can prevent incidence of external light on the switching thin film transistor and the current control thin film transistor.

Any known thin film transistors may be employed as the switching thin film transistors and the current control thin film transistors in the inventive display device. More specifically, the thin film transistors each essentially include an active layer, a gate insulating film and a gate electrode. The structure of the thin film transistors is not particularly limited, but may be of a stagger type, an inverted stagger type, a top gate type, a coplanar type or the like.

The active layer is not particularly limited, but may be composed, for example, of an inorganic semiconductor material such as amorphous silicon, polycrystalline silicon, microcrystalline silicon or cadmium selenide, or an organic semiconductor material such as a thiophene oligomer or poly(p-phenylene vinylene). Formation of the active layer may be achieved, for example, by forming an amorphous silicon layer by a plasma CVD method and then ion-doping the amorphous silicon layer; by forming an amorphous silicon layer with the use of $SiH_4$ gas by an LPCVD method, crystallizing the amorphous silicon layer by a solid phase epitaxy method for formation of a polysilicon layer, and ion-doping the polysilicon layer by an ion implantation method; by forming an amorphous silicon layer with the use of $Si_2H_6$ gas by an LPCVD method or with the use of $SiH_4$ gas by a PECVD method, annealing the amorphous silicon layer by a laser such as excimer laser to crystallize the amorphous silicon layer for formation of a polysilicon layer, and ion-doping the polysilicon layer by an ion doping method (low temperature process); or by forming a polysilicon layer by a reduced pressure CVD method or an LPCVD method, thermally oxidizing the polysilicon layer at 1000° C. or higher for formation of a gate insulating film, forming a gate electrode of $n^+$ polysilicon on the gate insulating film, and ion-doping the polysilicon layer by an ion implantation method (high temperature process).

The gate insulating film may be any conventional gate insulating film, and examples thereof include a $SiO_2$ film formed by a PECVD method or an LPCVD method, and an $SiO_2$ film formed by thermally oxidizing a polysilicon film. Where the gate insulating film functions as the light-shielding layer as will be described later, the gate insulating film is preferably formed as covering the active region and an EL device formation region on the substrate.

The gate electrode may be any conventional gate electrode, and exemplary materials therefor include polysilicon; high melting point metals such as titanium, tantalum and tungsten; silicides and polycides of high melting point metals; and metals such as aluminum and copper.

The switching thin film transistor and the current control thin film transistor to be employed in the present invention may be of a single gate structure, a double gate structure, or a multi-gate structure having three or more gate electrodes. Further, the thin film transistors may have an LDD structure, DDD structure or an offset structure.

In the present invention, the two thin film transistors, i.e., the switching thin film transistor and the current control thin film transistor, are required for driving each pixel. Alternatively, three, four or more thin film transistors may be provided for suppression of variations in electrical characteristics of these thin film transistors.

Any known EL devices may be employed as the EL device in the inventive display device. For example, the EL device include an EL layer having at least one light emitting layer, a pixel electrode and a counter electrode.

The EL layer is not particularly limited but, for example, may be of a single layer structure or a laminate structure having:

(1) a light emitting layer;

(2) a hole transporting layer and a light emitting layer;

(3) a light emitting layer and an electron transporting layer;

(4) a hole transporting layer, a light emitting layer and an electron transporting layer;

(5) a hole injecting layer, a hole transporting layer, a light emitting layer and an electron transporting layer; or (6) a buffer layer, a hole transporting layer, a light emitting layer, and an electron transporting layer.

The light emitting layer may be of a single layer structure or a multi-layer structure. A light emitting material to be used for the light emitting layer may be any known light emitting material for organic ELs. Examples thereof include: low molecular light emitting materials (e.g., fluorescent organic materials including aromatic dimethylidene compounds such as 4,4'-bis(2,2-diphenylvinyl)biphenyl (DPVBi), oxadiazole compounds such as 5-methyl-2-[2-[4-(5-methyl-2-benzoxazolyl) phenyl]vinyl]benzoxazole, triazole compounds such as 3-(4-biphenylyl)-4-phenyl-5-t-butylphenyl-1,2,4-triazole (TAZ), styrylbenzene compounds such as 1,4-bis(2-methylstyryl)benzene, thiopyrazine dioxide derivatives, benzoquinone derivatives, naphthoquinone derivatives, anthraquinone derivatives, diphenoquinone derivatives and fluorenone derivatives, and fluorescent organic metal compounds such as azomethine zinc complexes and (8-hydroxyquinolinato) aluminum complexes ($Alq_3$)); polymeric light emitting materials (e.g., poly(2-decyloxy-1,4-phenylene) (DO-PPP), poly[2,5-bis [2-(N,N,N-triethylammonium)ethoxy]-1,4-phenyl-alto-1,4-phenylene]dibromide (PPP-$NEt_3^+$), poly[2-(2'-ethylhexyloxy)-5 methoxy-1,4-phenylene vinylene] (MEH-PPV), poly[5-methoxy-(2-propanoxysulfonide)-1,4-phenylene vinylene] (MPS-PPV), poly[2,5-bis(hexyloxy)-1,4-phenylene-(1-cyanovinylene)] (CN-PPV) and poly(9,9-dioctylfluorene) (PDAF)); and precursors of polymeric light emitting materials (e.g., precursors of PPV, PNV and PPP). The light emitting layer may be composed of any of the aforesaid light emitting materials alone, or contain a hole transporting material, an electron transporting material, an additive (a donor, an acceptor or the like) or a luminescent dopant, which may be dispersed in a polymeric material or an inorganic material.

The charge transporting layers (the hole transporting layer and the electron transporting layer) may be of a single layer structure or a multi-layer structure. Charge transporting materials to be used for the charge transporting layers may be any known charge transporting materials for organic ELs and organic photoconductors, but are not particularly limited. Examples of the charge transporting materials include: hole transporting materials (e.g., inorganic p-type semiconductor materials, low molecular materials including porphyrin compounds, aromatic tertiary amine compounds such as N,N'-bis(3-methylphenyl)-N,N'-bisphenyl-benzidine (TPD) and N,N'-di(naphthalene-1-yl)-N,N'-diphenyl-benzidine (NPD), hydrazone compounds, quinacridone compounds and styrylamine compounds; polymeric materials including polyaniline (PANI), 3,4-polyethylene dioxythiophene/polystyrene sulfonate (PEDT/PSS), poly[triphenylamine derivative] (poly-TPD) and polyvinylcarbazole (PVCz), and precursors of polymeric materials such as a precursor of poly(p-phenylene vinylene) (Pre-PPV) and a precursor of poly(p-naphthalene vinylene) (Pre-PNV)); and electron transporting materials (e.g., inorganic n-type semiconductor materials, low molecular materials including oxadiazole derivatives, triazole derivatives, thiopyrazine dioxide derivatives, benzoquinone derivatives, naphthoquinone derivatives, anthraquinone derivatives, diphenoquinone derivatives and fluorenone derivatives, and polymeric materials including poly[oxadiazole derivative] (Poly-OXZ)). The charge transporting layers may be composed of any of the aforesaid charge transporting materials alone, or contain an additive or the like. The charge transporting material may be dispersed in a polymeric material or an inorganic material.

Formation of the light emitting layer and the charge transporting layers is achieved, for example, by a wet process such as a coating method (e.g., a spin coating method, a dipping method or a doctor blade method), a printing method (e.g., an ink jet method or a screen printing method), or by a dry process such as an evaporation method, a vacuum evaporation method or a laser transfer method (Japanese Unexamined Patent Publication No. Hei 11(1999)-260549).

The pixel electrode is not particularly limited, but may be composed of any conventional electrode material. The pixel electrode is typically paired with a counter electrode, and serves as an anode or a cathode. Usable as the anode are metal electrodes such as of Au, Pt and Ni having a higher work function, and transparent electrodes such as of ITO, IDIXO and $SnO_2$. Usable as the cathode are metal electrodes such as of Ca, Al, an Mg—Ag alloy and an Li—Al alloy having a lower work function, and combination electrodes including a thin insulating layer and a metal electrode (e.g., LiF/Al). An EB method, a sputtering method, a resistance heating evaporation method or a laser transfer method may be employed for formation of the pixel electrode, and a photolithography method may be employed for patterning.

Where the emitted light is to be outputted from a pixel electrode side, the transparent electrode is preferably employed as the pixel electrode. Where the emitted light is not to be outputted from the pixel electrode side, a light-shielding pixel electrode having a light-shielding property is preferably employed as the pixel electrode. Further, the light-shielding pixel electrode may be employed in combination with a conventional pixel electrode. Examples of the light-shielding pixel electrode include black electrodes such as of tantalum and carbon, and reflective electrodes such as of aluminum, silver and an aluminum-lithium alloy.

The thickness of the pixel electrode is not particularly limited, but may properly be adjusted depending on the size and performance of the display device, the material for the pixel electrode, and the like. Particularly, where the light-shielding pixel electrode is employed as the pixel electrode, the thickness thereof is preferably not smaller than 100 nm, more preferably not smaller than 200 nm, to provide a sufficient light-shielding effect.

The counter electrode to be paired with the pixel electrode may correspondingly serve as a cathode or an anode. Where the counter electrode serves as the anode, the pixel electrode serves as the cathode. Where the counter electrode serves as the cathode, the pixel electrode serves as the anode. Further, where the emitted light is to be outputted from a counter electrode side, the transparent electrode is preferably employed as the counter electrode.

The counter electrode can be formed by an EB method, a sputtering method, a resistance heating evaporation method or the like. In consideration of a thermal damage to the EL layer, the resistance heating evaporation method, a laser transfer method or a D.C. reactive sputtering method is preferably employed for the formation of the counter electrode.

The EL devices in the inventive display device may further comprise a polarization plate, and a sealing film or a sealing plate.

A conventional linear polarization plate and a ¼λ plate may be employed in combination as the polarization plate. This improves the contrast of the display device.

The sealing film or the sealing plate may be formed of a material conventionally employed for the sealing of the display device in a conventional manner. For example, the display device is sealed with a glass or a metal with an inert gas such as nitrogen gas or argon gas filled therein. In this case, a moisture absorber such as barium oxide may be mixed with the inert gas. Alternatively, the sealing film may be formed by spin-coating a resin directly on the counter electrode or bonding a resin film onto the counter electrode.

Thus, intrusion of external oxygen and moisture into the devices can be prevented to effectively improve the service life of the devices.

In the inventive display device, connection among the thin film transistors, the capacitor and the interconnections (the signal lines, the scanning lines, the common lines and the like) may be arranged in any manner so as to drive the EL devices. For example, the connection may be arranged so that an EL device in each pixel is driven only by one or two thin film transistors or by one thin film transistor and one capacitor, but is preferably arranged so that the EL device is driven by at least two thin film transistors and one capacitor. Further, the connection may be arranged so that the EL device is driven by three or more thin film transistors and one capacitor or by two or more thin film transistors and two or more capacitors. More specifically, the thin film transistors are provided on the substrate, and an interlayer insulating film overlies the thin film transistors. The EL device having the pixel electrode, the EL layer and the counter electrode extends from the thin film transistor over the resulting substrate, and the pixel electrode of the EL device is connected to the thin film transistor via a contact hole formed in the interlayer insulating film on the drain region of the thin film transistor.

In the inventive display device, the light-shielding layer is provided in such a manner as to prevent the light emitted from the electroluminescent devices from reaching the thin film transistors. This means that the material for and the position, size and configuration of the light-shielding layer are properly selected to realize the light-shielding function.

For example, the light-shielding layer is preferably capable of absorbing or reflecting light of a specific wavelength emitted from the light emitting layers of the EL devices. The light absorption or reflection may be achieved by utilizing optical interference. For example, the light-shielding layer may be of a laminate structure including an insulating film of a proper thickness and amorphous silicon or polysilicon layers holding the insulating film therebetween, and interference occurring between the amorphous silicon or polysilicon layers is utilized for the light absorption or reflection. The light absorption or reflection is preferably as great as possible. The rate of the light absorption or reflection is, for example, 50% or greater, 70% or greater, or 90% or greater, but may be several percent or greater in the present invention. Particularly, the light-shielding layer preferably has a transmittance of 30% or smaller, more preferably 20% or smaller, further more preferably 10% or smaller, at a peak wavelength of the light emitted from the light emitting layers. Thus, the alteration or deterioration in the characteristics of the semiconductor layers of the thin film transistors can effectively be suppressed.

The light-shielding layer is preferably disposed in a light path along which the light emitted from the light emitting layers of the EL devices travels to be incident on the semiconductor layers of the thin film transistors, or in a light path along which the light emitted from the light emitting layers of the EL devices travels to be reflected on the pixel electrodes or the counter electrodes and incident on the semiconductor layers of the thin film transistors.

More specifically, the light-shielding layer is disposed between the active layers of the thin film transistors and the EL devices to cover the active layers. For example, the light-shielding layer may be embodied as an insulating film covering the thin film transistors (active layers) and/or peripheral regions thereof, as the gate insulating films of the thin film transistors, as an interlayer insulating film provided between the thin film transistors and the electroluminescent layers, or as the pixel electrodes. The light-shielding layer may be embodies as two or more of these films.

Where the light-shielding layer is embodied as the insulating film, the gate insulating film or the interlayer insulating film, the light-shielding layer is preferably a black inorganic insulating film or a resin layer containing a black pigment or a black dye dispersed therein. Examples of a material for the black inorganic insulating film include a black matrix material and $Ni_xZn_yFe_2O_4$. Examples of a material for the black pigment or dye containing resin layer include polyimide resins containing carbon black, phthalocyanine or quinacridone dispersed therein, and color resists.

The light-shielding layer may be formed by a dry process such as a sputtering method, a CVD method or a vacuum evaporation method or by a wet process such as a spin coating method, and patterned by a photolithography method or the like.

At least one of the insulating film, the gate insulating film and the interlayer insulating film may serve as the light-shielding layer. In this case, the other of these films may serve as an ordinary insulating film, gate insulating film or interlayer insulating film.

Exemplary materials for the insulating film include inorganic materials such as $SiO_2$, $SiN(Si_3N_4)$ and $TaO(Ta_2O_5)$, and organic materials such as acrylic resins and resist materials. Exemplary materials for the interlayer insulating film include polyimide, PSG, BPSG, SOG, $SiO_2$ and SiN ($Si_3N_4$). The interlayer insulating film may be patterned in the same manner as the insulating film.

It is preferred that at least one of the insulating film, the gate insulating film and the interlayer insulating film is a layer composed of a resin material, and an inorganic insulating film is preferably provided between the resin layer and the thin film transistors and/or the substrate, or between the resin layer and the pixel electrodes. Examples of materials for the resin layer and the inorganic insulating film include those previously described.

The inventive display device preferably includes, in addition to the aforesaid light-shielding layer, a second light-shielding layer provided in such a manner as to prevent external light from reaching the thin film transistors. This means that the material for and the position, size and configuration of the second light-shielding layer are properly selected to realize the light-shielding function. For example, the second light-shielding layer may be provided below the thin film transistors or below the thin film transistors and the peripheral regions thereof. The material and the formation method for the second light-shielding layer are the same as described above.

As described above, the inventive display device includes the capacitors. The capacitors may be any conventional capacitors typically including a pair of electrodes and an insulating film held therebetween.

As in a typical light emitting display device, signal lines, scanning lines, common lines, first drive electrode lines and second drive electrode lines are provided in the inventive display device, and these lines may be formed, for example, of a metal such as Ta, Al or Cu.

With reference to the attached drawings, the luminescent display device of active matrix drive type and the fabrication method therefor according to the present invention will hereinafter be described by way of embodiments thereof.

Embodiment 1

Figure 2:
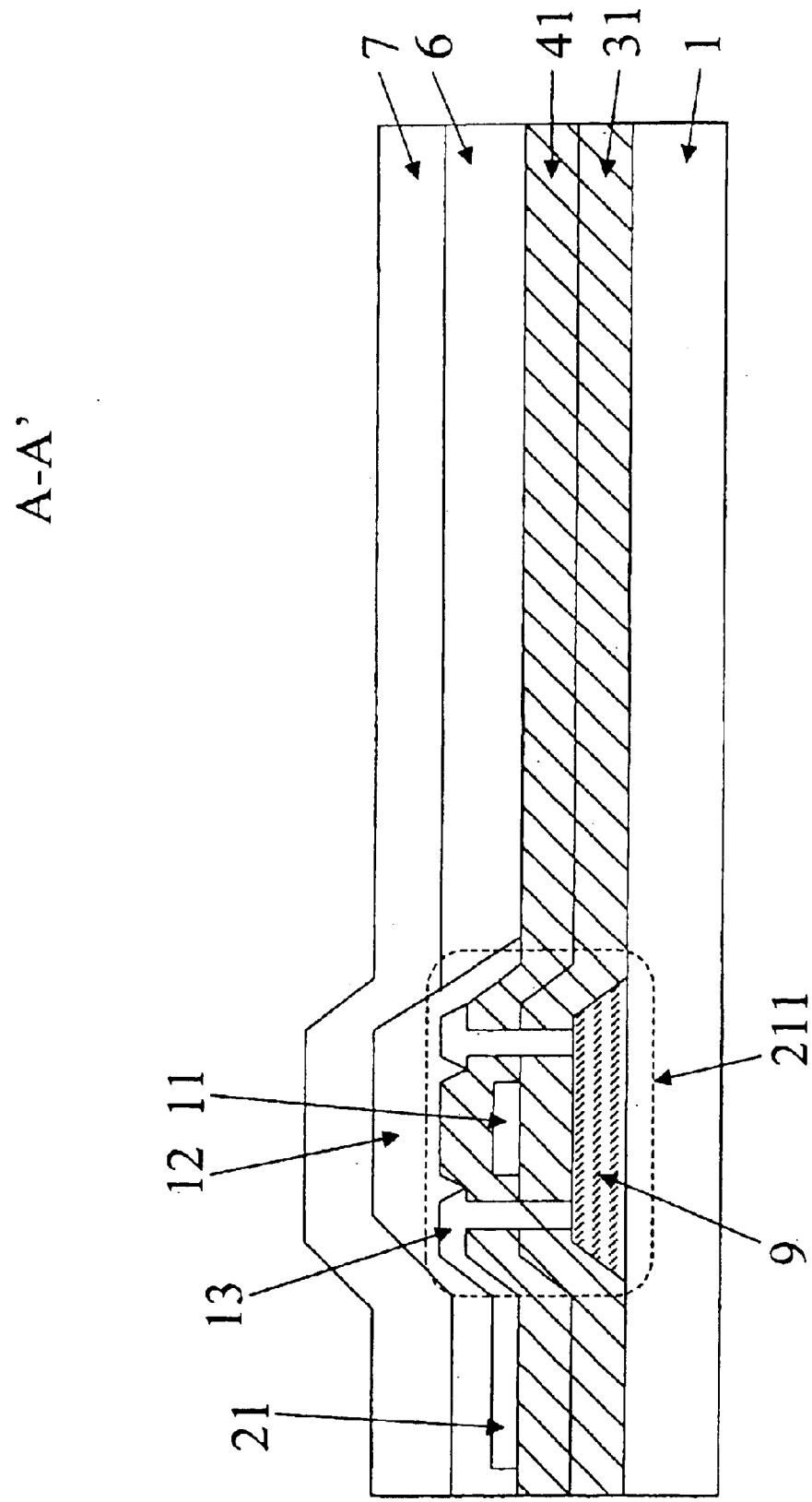
FIG. 2 is a sectional view taken along a line A–A' in FIG. 1.
Figure 3:
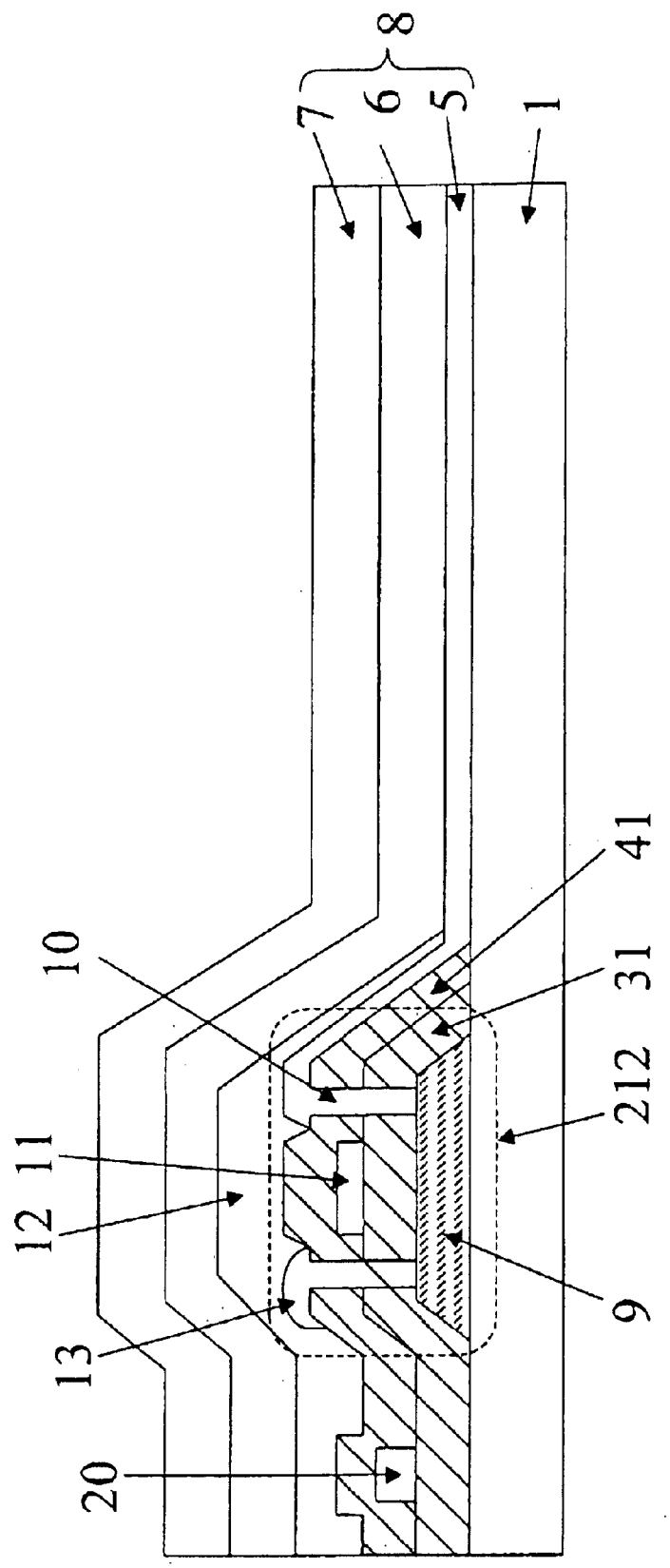
FIG. 3 is a sectional view taken along a line B–B' in FIG. 1.

A luminous display device of active matrix drive type according to this embodiment has a switching thin film transistor 211, a current control thin film transistor 212 and an EL device 8 provided on a substrate 1 for each pixel as shown in FIGS. 1 to 3.

The thin film transistors 211 and 212 each include an active layer 9 provided on the substrate 1 and a gate electrode 11 provided on the active layer 9 with the intervention of a light-shielding gate insulating film 31. A light-shielding inter-level film 41 is provided over the thin film transistor 211, 212 as covering the thin film transistor 211, 212 and a peripheral region thereof. Further, an insulating film 12 is provided on the interlayer insulating film 41 above the thin film transistor 211, 212. The interlayer insulating film 41 and the gate insulating film 31 are each composed of a light-shielding material.

The EL device 8 is connected to the active layer 9 of the current control thin film transistor 212 via a contact hole 10, and includes a pixel electrode 5 extending over the pixel, an EL layer 6 having at least one light emitting layer provided on the pixel electrode 5, and a counter electrode 7 provided on the EL layer 6.

In FIGS. 1 to 3, reference numerals 20, 21, 22 and 24 denote a scanning line, a signal line, a common line and a capacitor, respectively.

In the display device, emitted light is outputted from the side of the substrate 1. By inputting signal pulses to the signal line (first drive line) and the scanning line (second drive line), the thin film transistors are switched to actuate or deactuate the EL device electrically connected to the thin film transistors in the unit pixel for displaying a motion picture and a still image.

Embodiment 2

Figure 4:
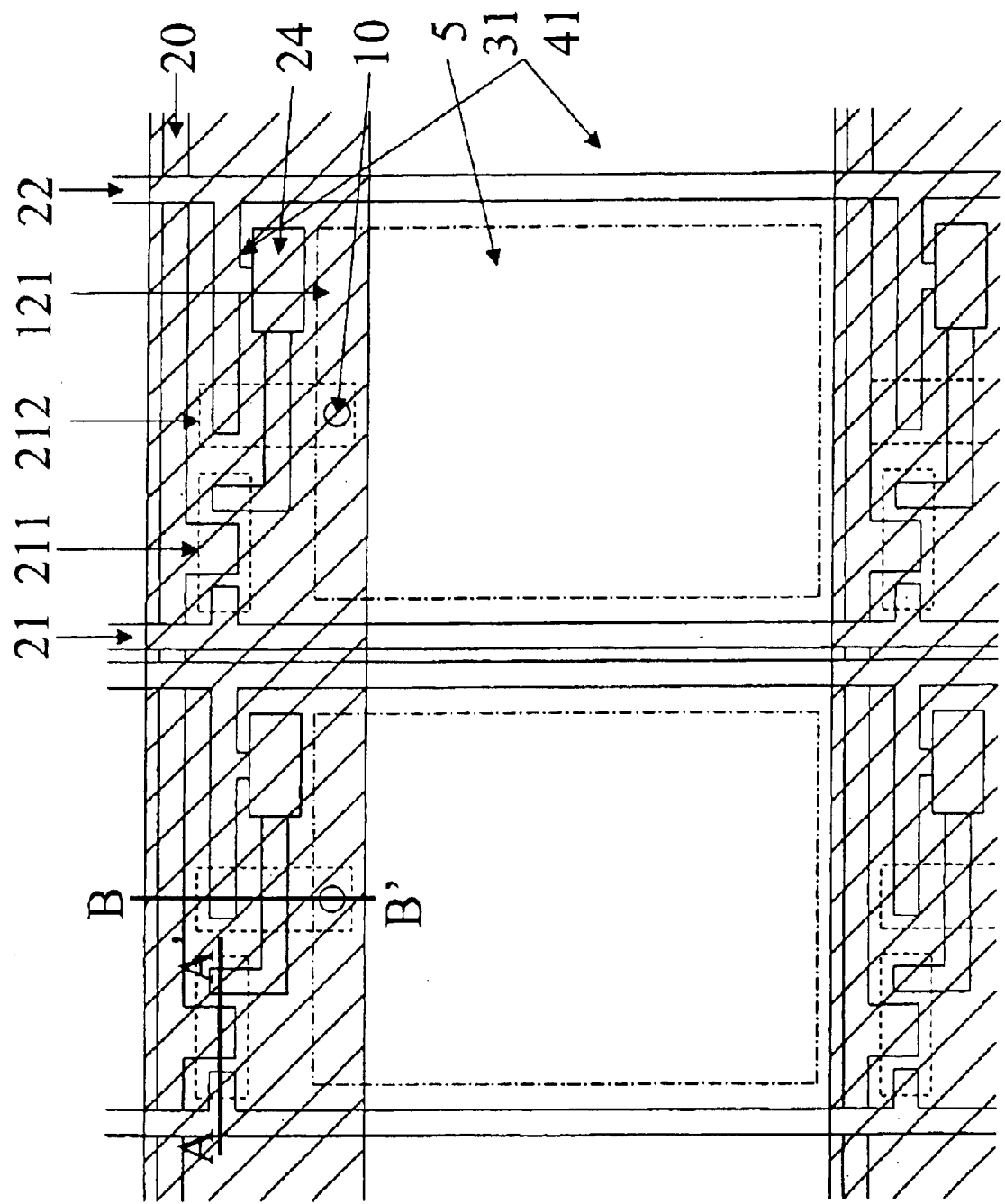
FIG. 4 is a schematic plan view illustrating a luminescent display device of active matrix drive type according to Embodiment 2 of the present invention.
Figure 5:
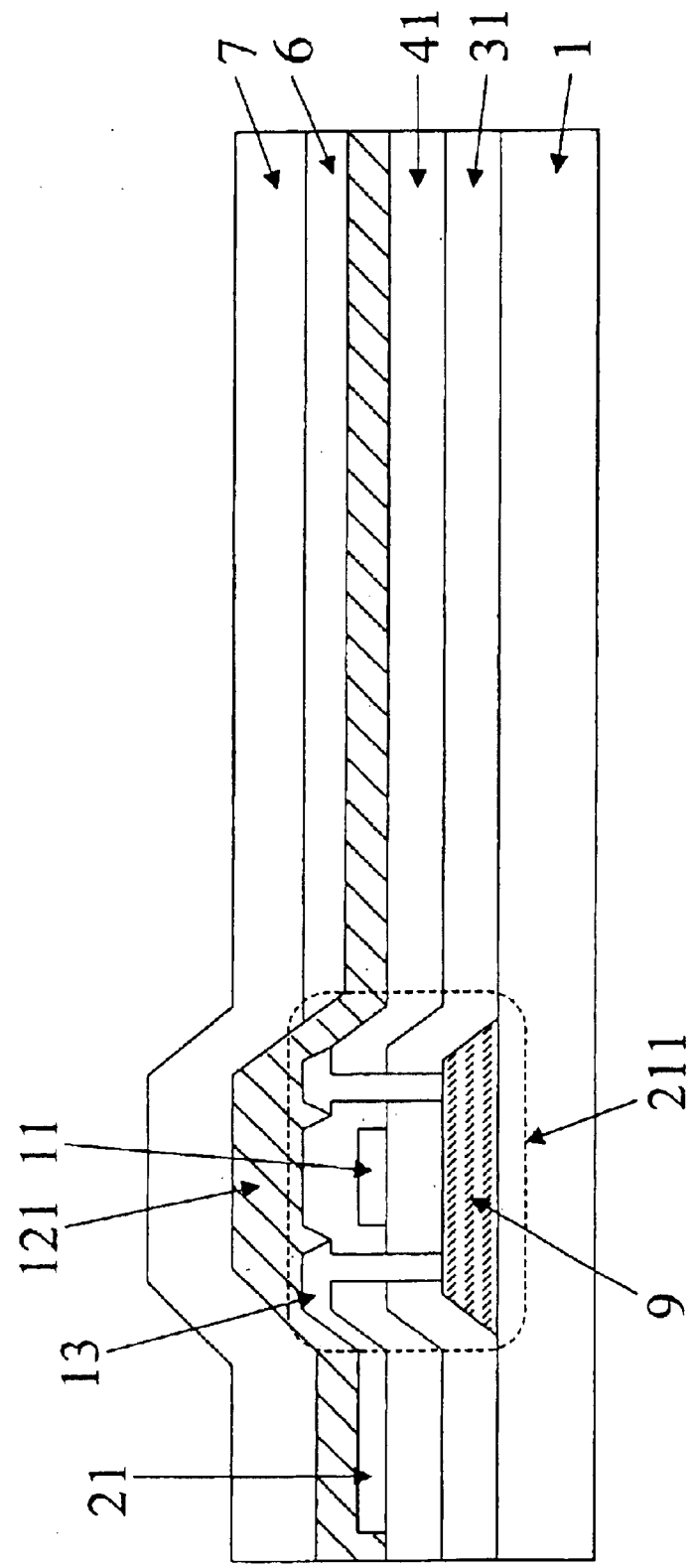
FIG. 5 is a sectional view taken along a line A–A' in FIG. 4.
Figure 6:
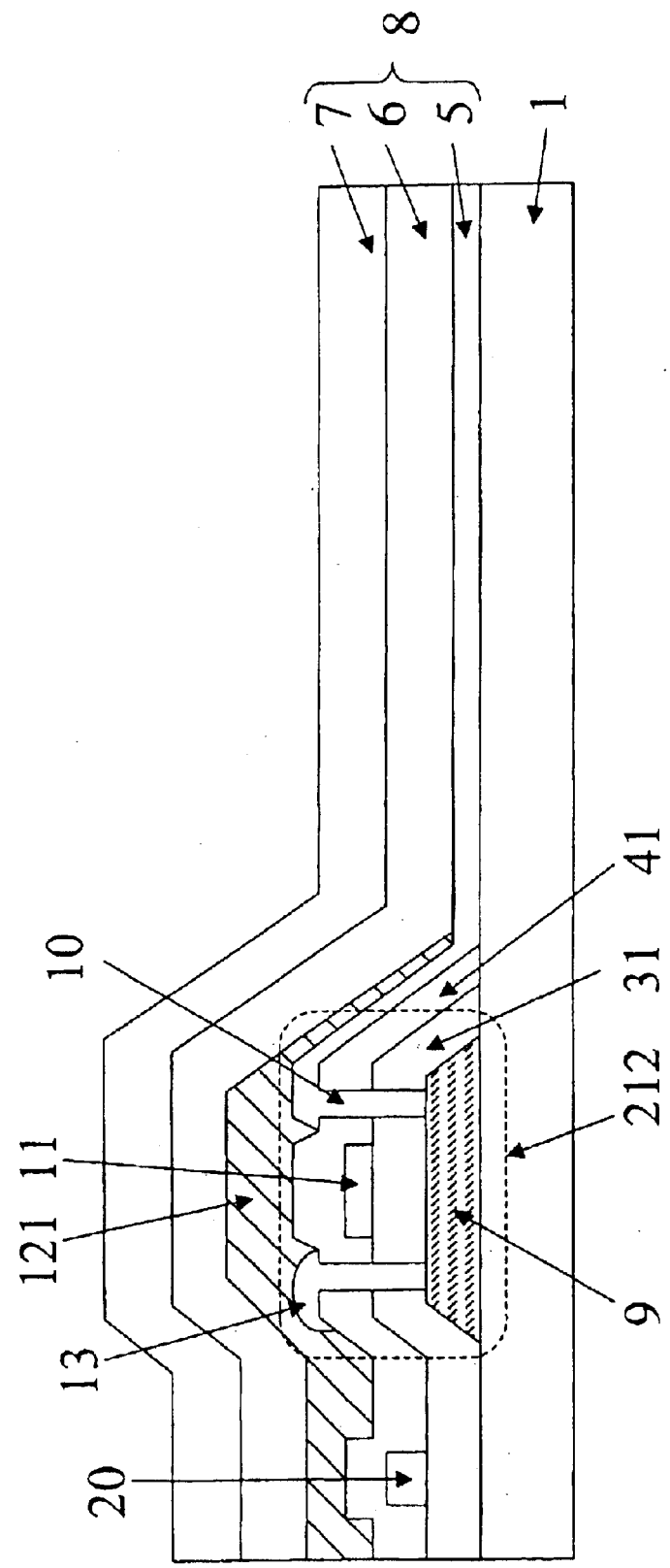
FIG. 6 is a sectional view taken along a line B–B' in FIG. 4.

As shown in FIGS. 4 to 6, a luminescent display device of active matrix drive type according to this embodiment has substantially the same construction as in Embodiment 1, except that the interlayer insulating film and the gate insulating film are composed of a material having no light-shielding property and a light-shielding insulating film 121 is provided instead of the insulating film 12.

Embodiment 3

Figure 7:
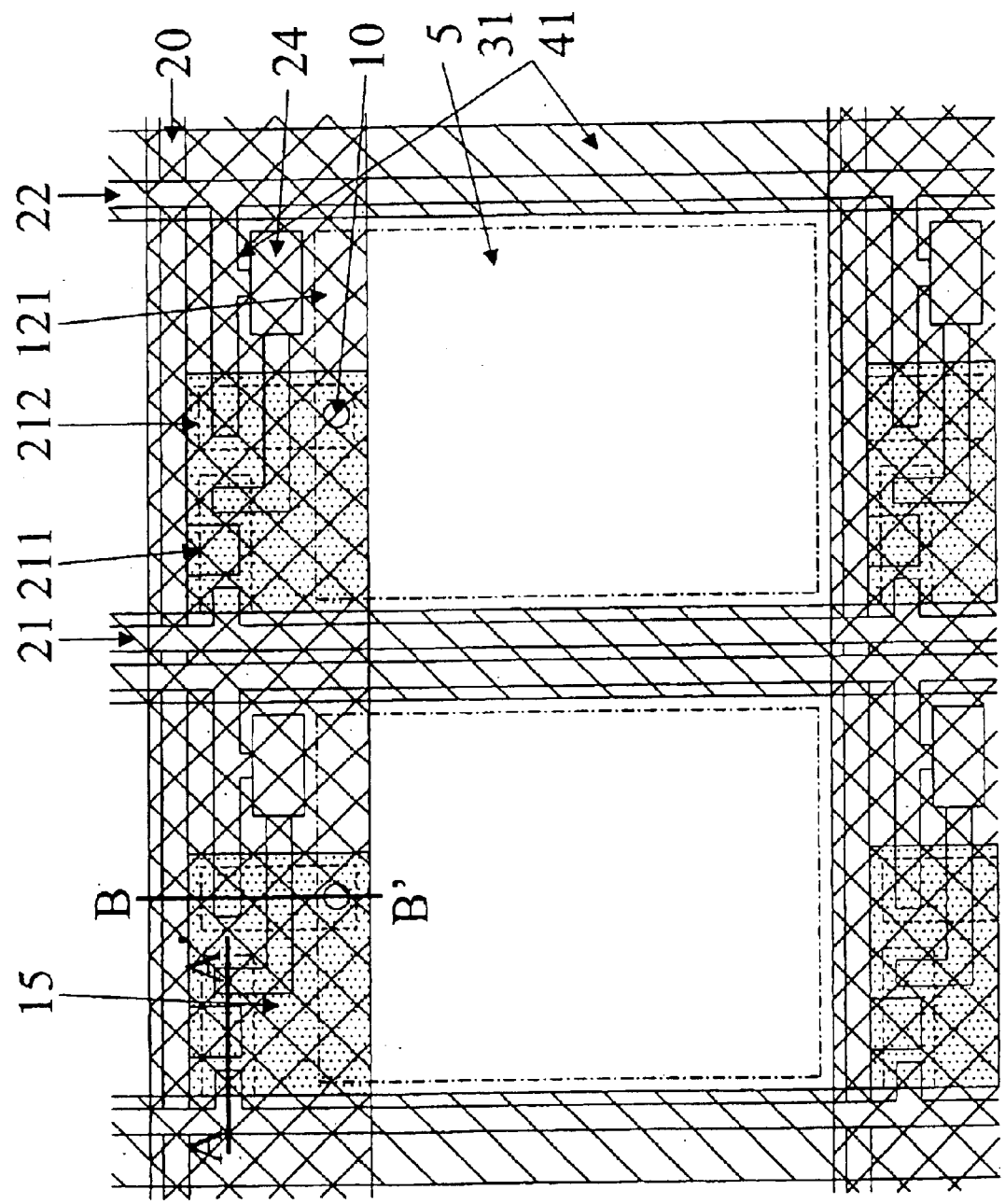
FIG. 7 is a schematic plan view illustrating a luminescent display device of active matrix drive type according to Embodiment 3 of the present invention.
Figure 8:
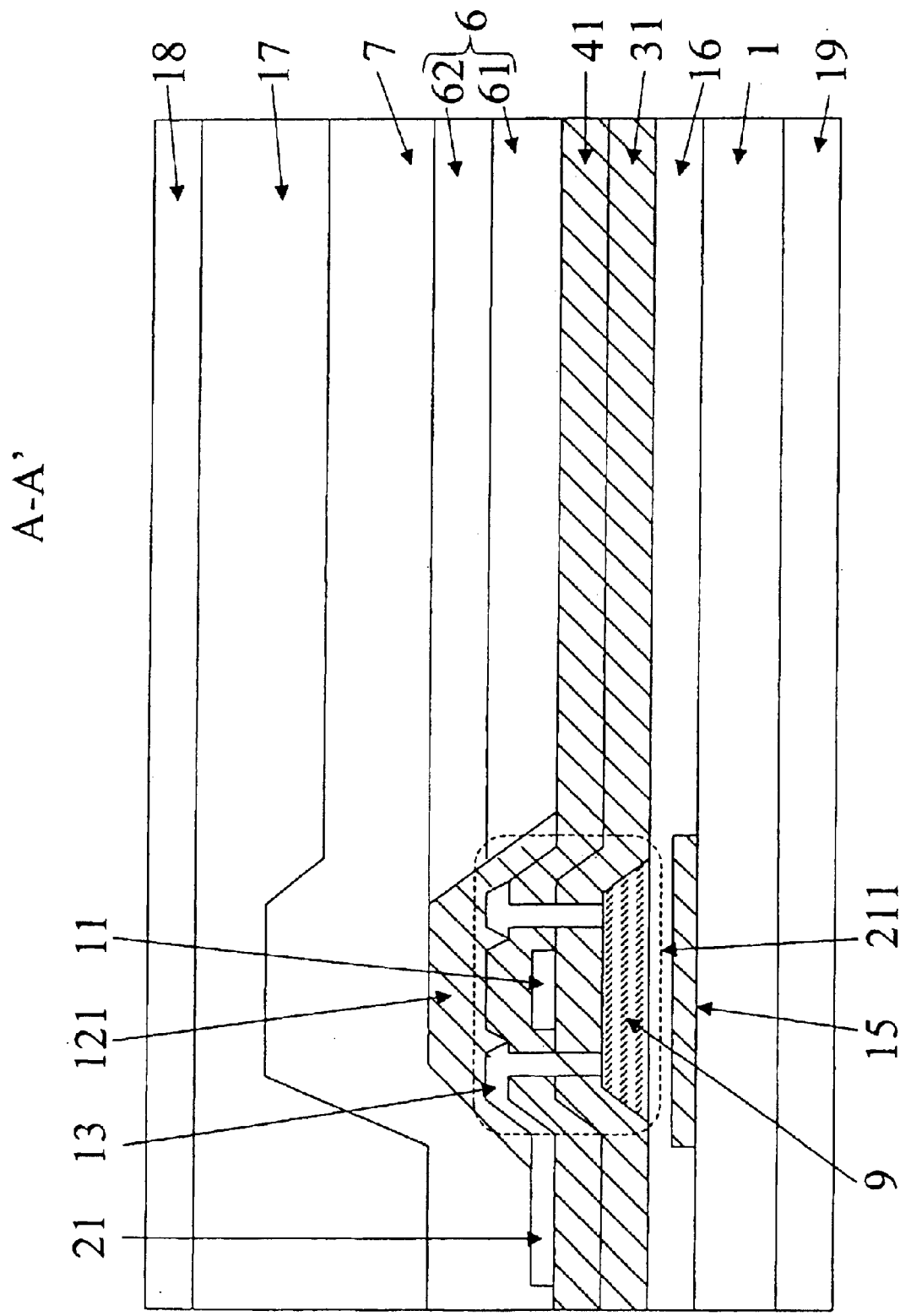
FIG. 8 is a sectional view taken along a line A–A' in FIG. 7.
Figure 9:
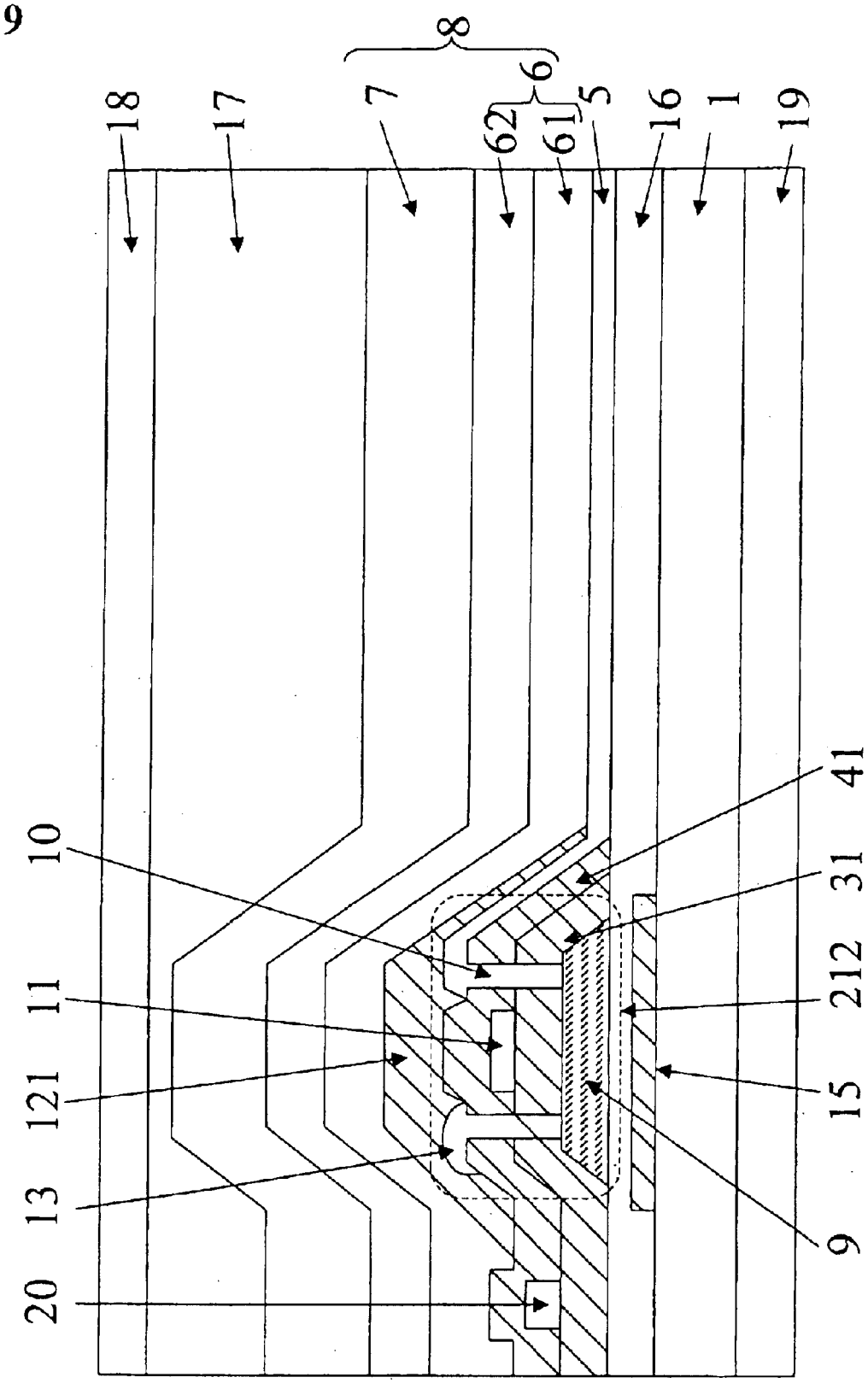
FIG. 9 is a sectional view taken along a line B–B' in FIG. 7.
Figure 10:
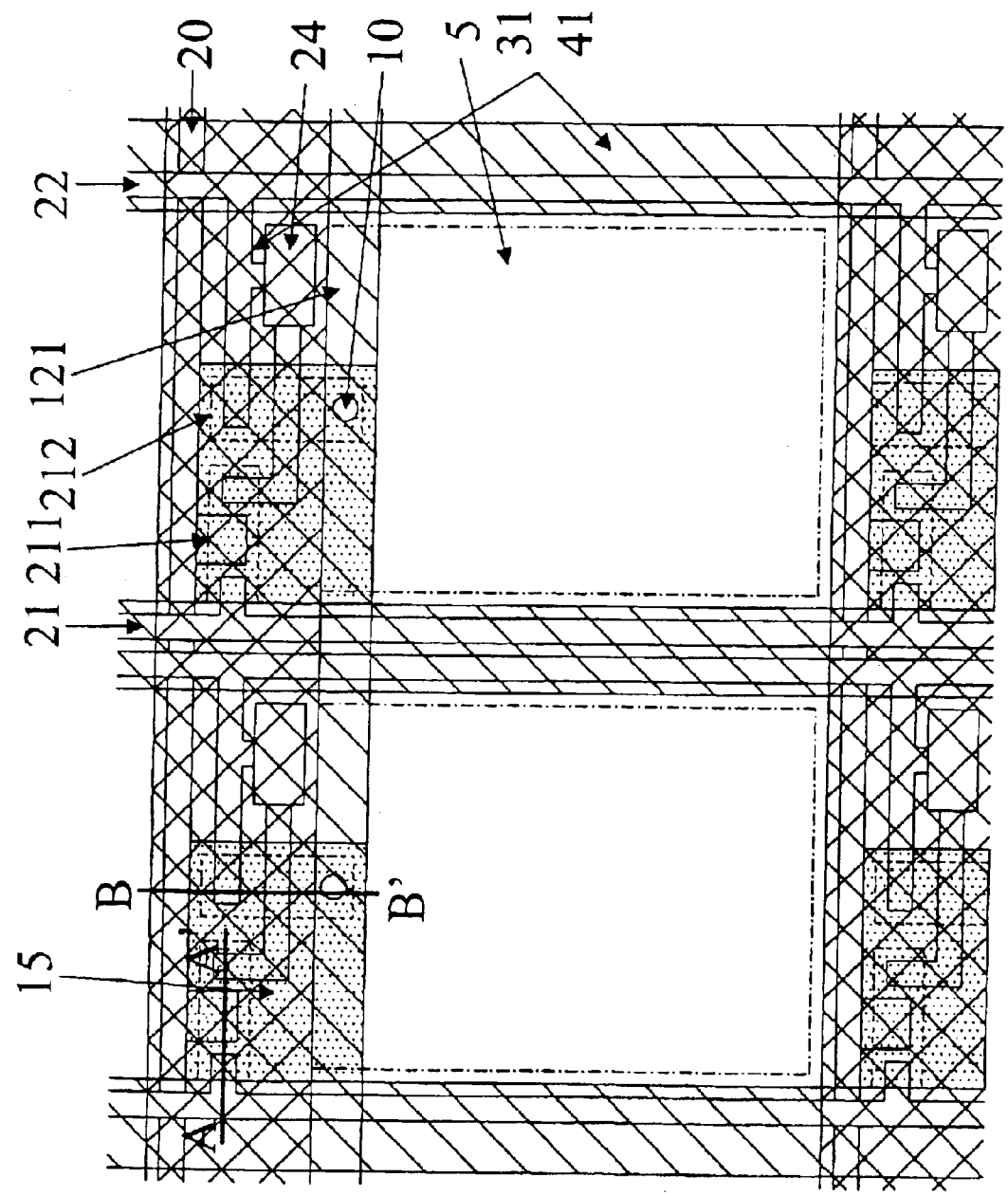
FIG. 10 is a schematic plan view illustrating a luminescent display device of active matrix drive type according to Embodiment 4 of the present invention.
Figure 11:
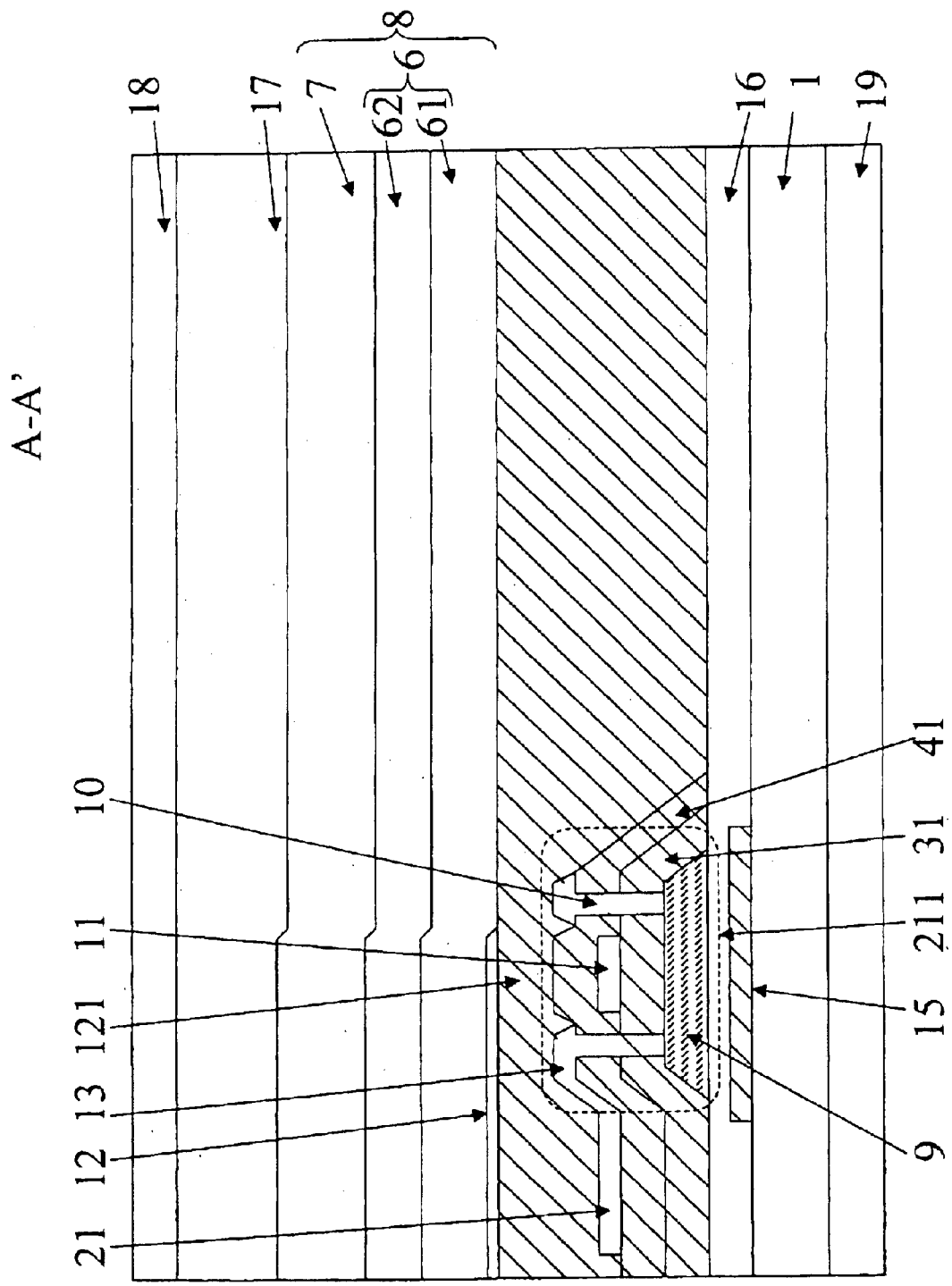
FIG. 11 is a sectional view taken along a line A–A' in FIG. 10.
Figure 12:
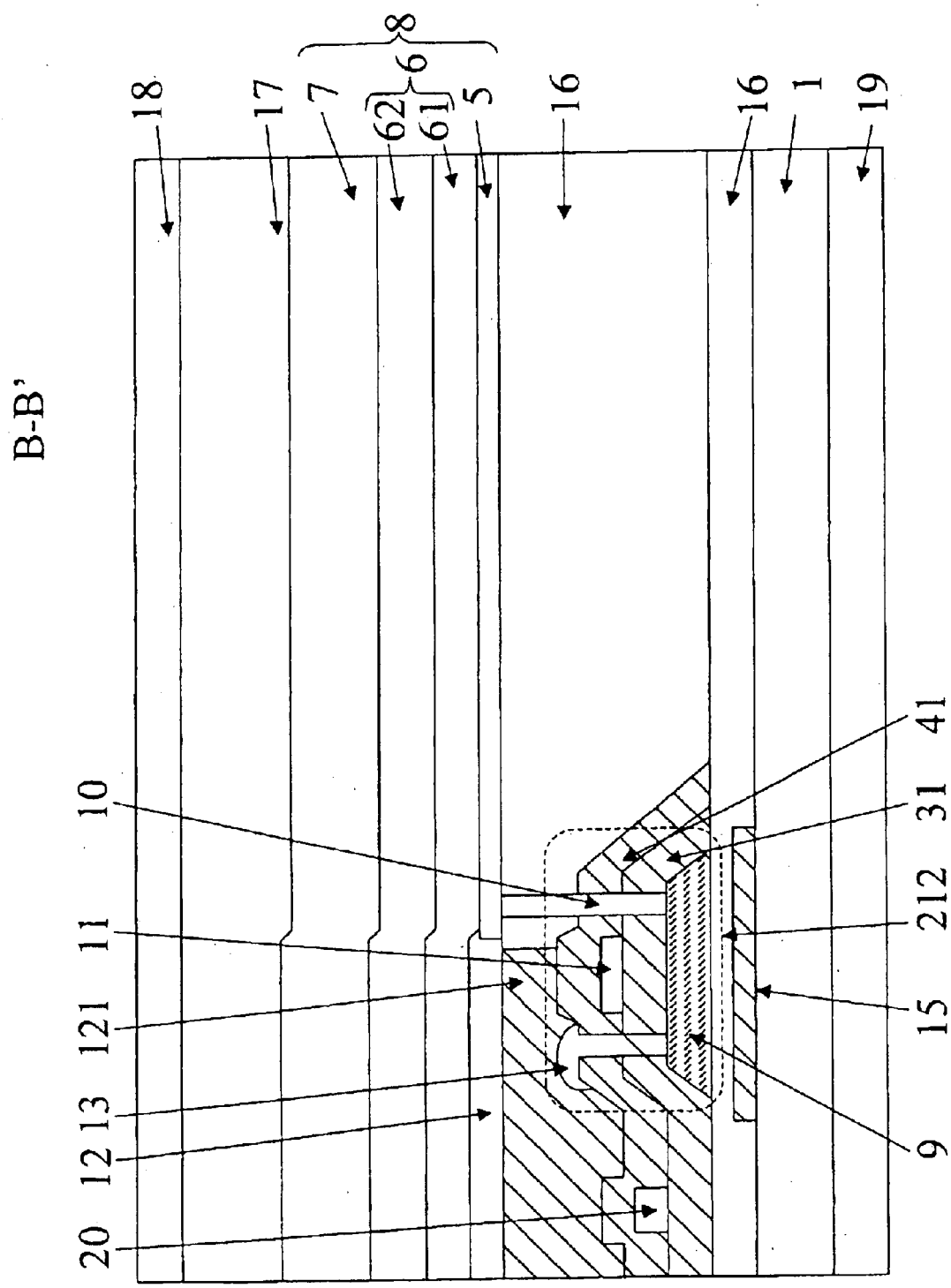
FIG. 12 is a sectional view taken along a line B–B' in FIG. 10.

As shown in FIGS. 7 to 9, a luminescent display device of active matrix drive type according to this embodiment has substantially the same construction as in Embodiment 2, except that a light-shielding layer 15 is provided below the thin film transistors 211, 212 on the substrate 1 for preventing external light incident on the substrate 1 from reaching the switching thin film transistor 211 and the current control thin film transistor 212, and a transparent insulating film 16 is provided over the light-shielding layer 15 on the substrate 1 for planarization of the light-shielding layer 15, that the EL layer 6 includes a hole transporting layer 61 and a red light emitting layer 62, that a polarization plate 19 is provided on a side of the substrate 1 opposite from the EL layer 6 for improvement of the contrast of the display device, and that a sealing plate 18 is provided above the counter electrode 7 with the intervention of an inert gas layer 17.

The luminescent display device was fabricated in the following manner.

A 0.6-$\mu$m thick tantalum film was formed as a light-shielding film 15 on a glass substrate 1 (thickness: 1.1 mm (±10%), resistance >$10^{14}$ $\Omega\cdot$cm, moisture content: 0%, gas permeability: 0%, distortion point: 667° C.) by a sputtering method. Then, the tantalum film is patterned by a photolithography method. The light-shielding layer 15 has a transmittance of not greater than 4% for the visible spectrum. The light-shielding layer 15 prevents external light from being incident on the active layers 9 of the TFTs.

In turn, a 2-$\mu$m thick transparent insulting film 16 of a polycarbonate resin was formed on the resulting substrate by a spin-coating method.

Subsequently, a 50-nm thick $SiO_2$ film was formed in active layer formation regions on the transparent insulating film 16.

A 50-nm thick α-Si film was formed on the resulting substrate by decomposing $Si_2H_6$ by an LP-CVD method, and then polycrystallized by excimer laser annealing for formation of a polysilicon film. The polysilicon film was patterned into a predetermined configuration for formation of active layers 9 in which channel regions and source/drain regions of thin film transistors were to be formed.

A 50-nm thick first gate insulating film of $SiO_2$ was formed on the substrate 1 formed with the active layers 9. Then, a 100-nm thick film of a photosensitive polyamide resin containing copper phthalocyanine dispersed therein was formed as a second gate insulating film 31 by a spin coating method, and patterned into a predetermined configuration by a photolithography method. The gate insulating film 31 functions as a light-shielding layer which absorbs light ranging from orange light to red light, because copper phthalocyanine has a strong absorption peak at 620 nm. The gate insulating film 31 had a transmittance of 10% at 610 nm which is a peak wavelength of light to be emitted from light emitting layers (which will be described later).

Then, an Al film was formed on the gate insulating film 31 by a sputtering method and patterned for formation of gate electrodes 11. At the same time, formation of lower electrodes of capacitors 24 was achieved. Thereafter, side faces of the gate electrodes 11 were subjected to anodic oxidization for formation of offset portions, and the active layers 9 were doped with phosphorus in a high concentration by an ion doping method for the formation of the source/drain regions. After scanning lines 20 were formed on the resulting substrate, a 300-nm thick film of a photosensitive polyamide resin containing copper phthalocyanine dispersed therein and a 50-nm thick $SiO_2$ film were formed over the resulting substrate in this order for formation of an interlayer insulating film 41, and patterned into a predetermined configuration. The interlayer insulating film had a transmittance of 4% at 610 nm which is the peak wavelength of the light to be emitted from the light emitting layers.

Contact holes 10 were formed in the interlayer insulating film 41, and source electrodes 13, drain electrodes and common electrodes and then upper electrodes of the capacitors were formed on the resulting substrate. Thus, the formation of switching thin film transistors 211 and current control thin film transistors 212 was achieved through a low temperature process.

A 150-nm thick ITO film was formed on the resulting substrate by a sputtering method for electrical connection to the drain electrodes via the contact holes 10. For the sputtering, the substrate was kept at 300° C. The ITO film was patterned into a predetermined configuration for formation of pixel electrodes 5. The pixel electrodes 5 thus formed each had a surface resistance of lower than 10 Ω/□, a transmittance of higher than 87% at 550 nm, and a flatness of ±2%.

For formation of an insulating film 121, a 50-nm thick $SiO_2$ film was formed on the resulting substrate, and then a 300-nm thick film of a polyamide resin containing copper phthalocyanine dispersed therein (which was the same material as for the first interlayer insulating film 41) was formed on the $SiO_2$ film by a spin coating method. The insulating film 121 was patterned as remaining only on the TFTs by a photolithography method. The insulating film 121 had a transmittance of 4% at 610 nm which is the peak wavelength of the light to be emitted from the light emitting layers.

In turn, a solution of PANI (polyaniline) and CSA (camphor sulfonate) was applied on the glass substrate 1 formed with the pixels 5 by a spin coating method for formation of a 50-nm thick hole transporting layer 61.

A coating liquid for a red light emitting layer was prepared by dissolving 1 g of MEH-PPV as a red light emitting material and 0.0001 g of KF96L-1 (Shinetsu Silicone Co., Ltd.) as a leveling agent in 100 ml of trimethylbenzene. With the use of a commercially available relief printer, the coating liquid was transferred from a transfer plate onto the hole transporting layer 61 for formation of the red light emitting layer. The transfer plate herein used was an APR plate (Shore A hardness: 55). The printing pressure was 0.1 mm. An anilox roller (300 lines/inch) was used for the printer.

Further, a 50-nm thick Ca film and a 200-nm thick Al film were formed in this order on the resulting substrate by a vacuum evaporation method with the use of a mask for formation of counter electrodes 7.

In turn, a sealing plate 18 of glass was bonded to the resulting substrate with a UV-curable resin in nitrogen gas. Further, a polarization plate 19 was bonded to the substrate 1 for improvement of the contrast of the display device.

When scanning signals were sequentially applied to the scanning lines after a power source was connected to the signal lines of the luminescent display device of active matrix drive type thus fabricated, light emission from every pixel was observed without luminous inconsistency. Even after the display device was continuously driven in a dark room for 100 hours, no cross-talk was observed. Further, luminescent characteristics of the display device were evaluated after the display device was left under a 300-lux fluorescent light for 100 hours and, as a result, no cross-talk was observed.

Embodiment 4

As shown in FIGS. 10 to 13, a luminescent display device of active matrix drive type according to this embodiment has substantially the same construction as in Embodiment 3, except that a transparent insulating film 16 and a flat insulating film 121 are provided below the pixel electrode 5 for planarization of the substrate formed with the switching thin film transistor 211 and the current control thin film transistor 212.

The luminescent display device was fabricated in the following manner.

Switching thin film transistors 211 and current control thin film transistors 212 were formed on a substrate 1 in substantially the same manner as in Embodiment 3, except that a 300-nm thick film of a photosensitive polyamide resin containing copper phthalocyanine dispersed therein was formed as the interlayer insulating film 41.

Subsequently, a 4-μm thick spin-on-glass film was formed as a transparent insulating film 16 on the resulting substrate by a spin coating method. In turn, contact holes 10 were formed, and Ag was deposited to a thickness of 4 μm on the resulting substrate by a sputtering method. Then, the light-shielding insulating film, the transparent insulating film and Ag deposited in the contact holes were polished by 5 μm for planarization thereof.

A 150-nm thick ITO film was formed on the resulting substrate by a sputtering method for electrical connection to the drain electrodes via the contact holes 10. For the sputtering, the substrate was kept at 300° C. The ITO film was etched for formation of pixel electrodes 5. The pixel electrodes 5 thus formed each had a surface resistance of lower than 10 Ω/□, a transmittance of higher than 87% at 550 nm, and a flatness of ±2%.

Then, an insulating film 12 of $SiO_2$ was formed as having a trapezoidal cross section between the pixel electrodes 5. This prevents degradation of the devices which may otherwise occur due to field concentration at edges of the pixel electrodes.

Thereafter, EL devices 8 were formed, and a sealing plate 18 was bonded to the resulting substrate with the intervention of an inert gas layer 17 as in Embodiment 3. Further, a polarization plate 19 was bonded to the substrate 1.

When scanning signals were sequentially applied to the scanning lines after a power source was connected to the signal lines of the luminescent display device of active matrix drive type thus fabricated, light emission from every pixel was observed without luminous inconsistency. Even after the display device was continuously driven in a dark room for 100 hours, no cross-talk was observed. Further, luminescent characteristics of the display device were evaluated after the display device was left under a 300-lux fluorescent light for 100 hours and, as a result, no cross-talk was observed.

Embodiment 5

Figure 13:
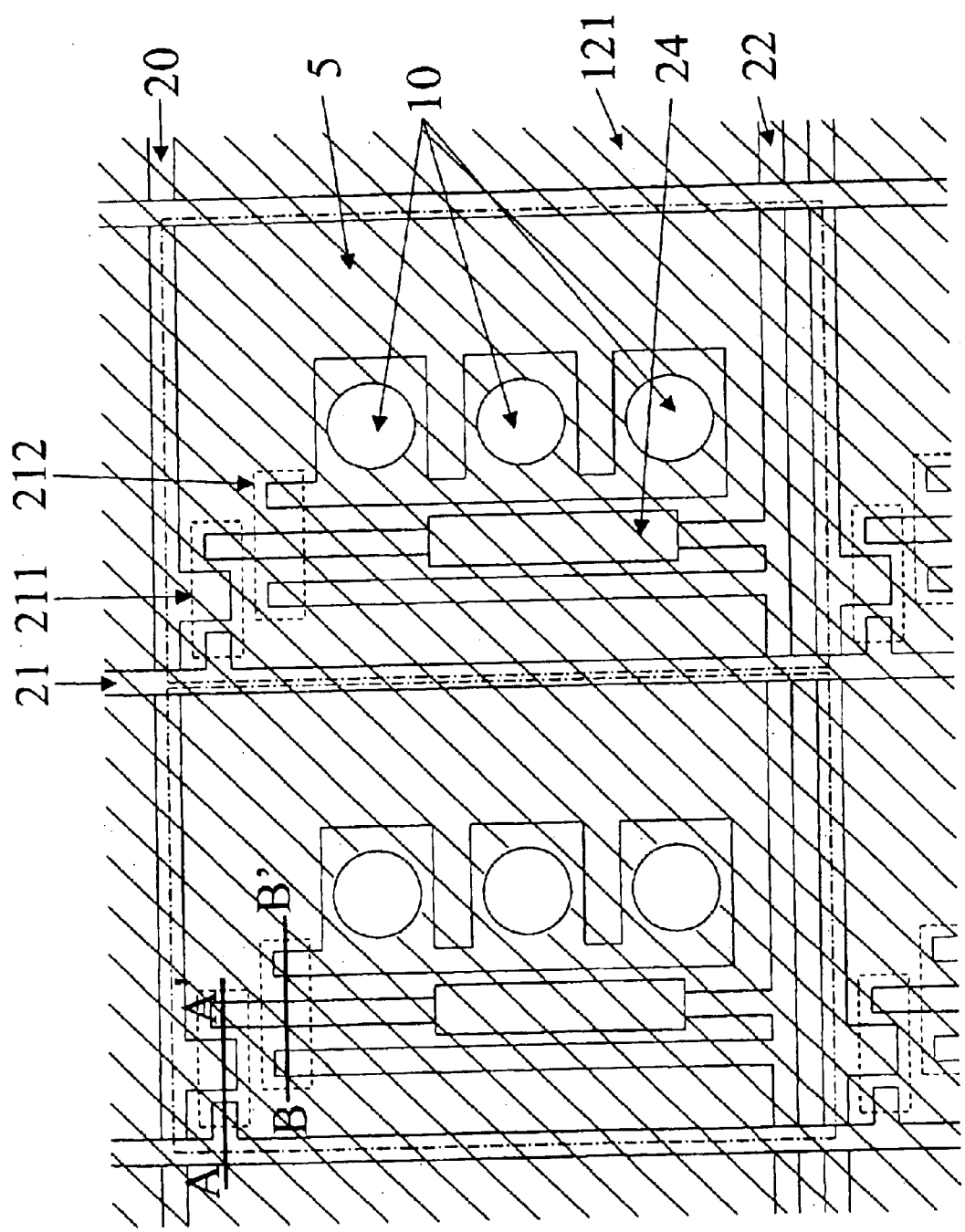
FIG. 13 is a schematic plan view illustrating a luminescent display device of active matrix drive type according to Embodiment 5 of the present invention.
Figure 14:
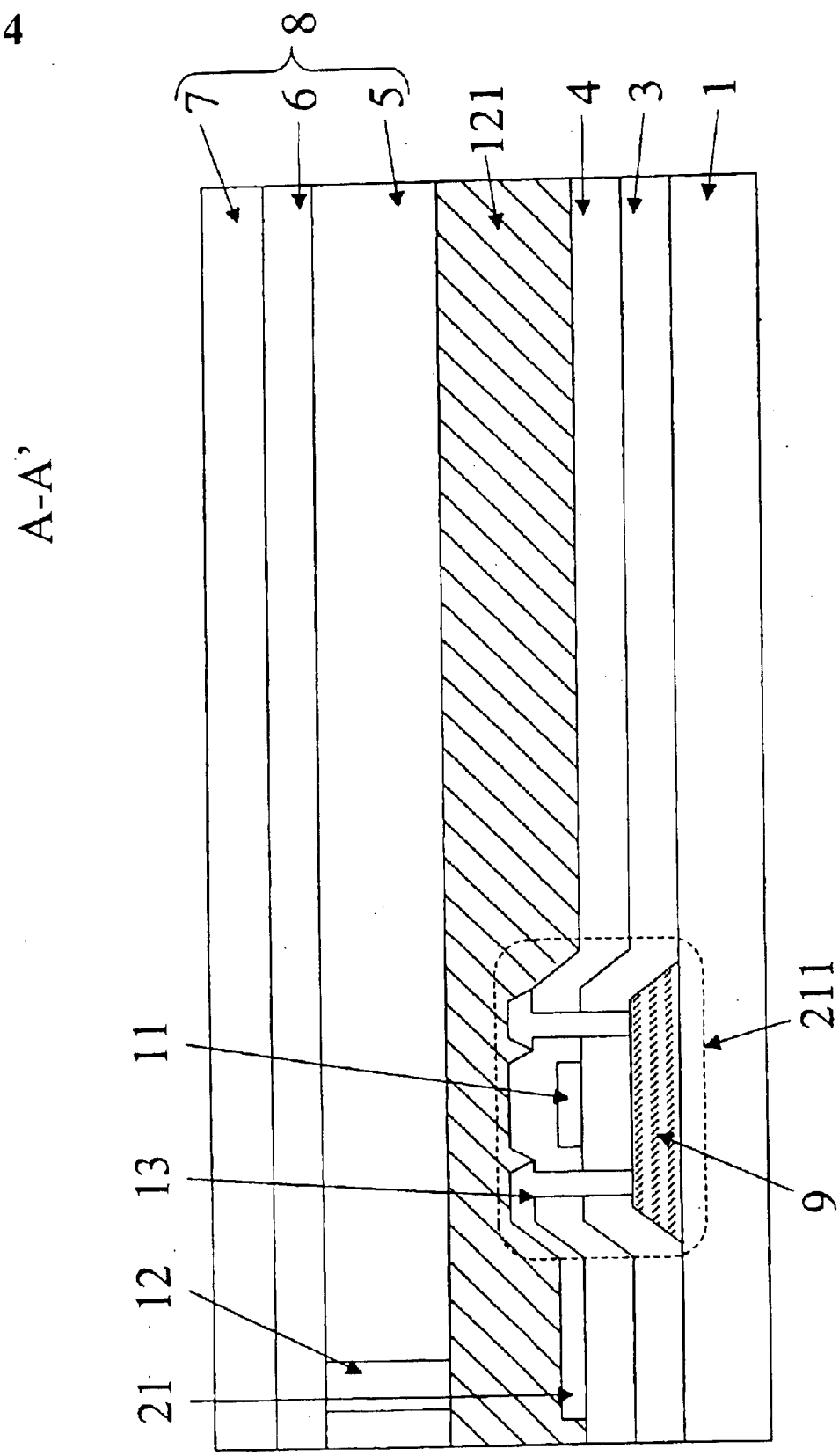
FIG. 14 is a sectional view taken along a line A–A' in FIG. 13.
Figure 15:
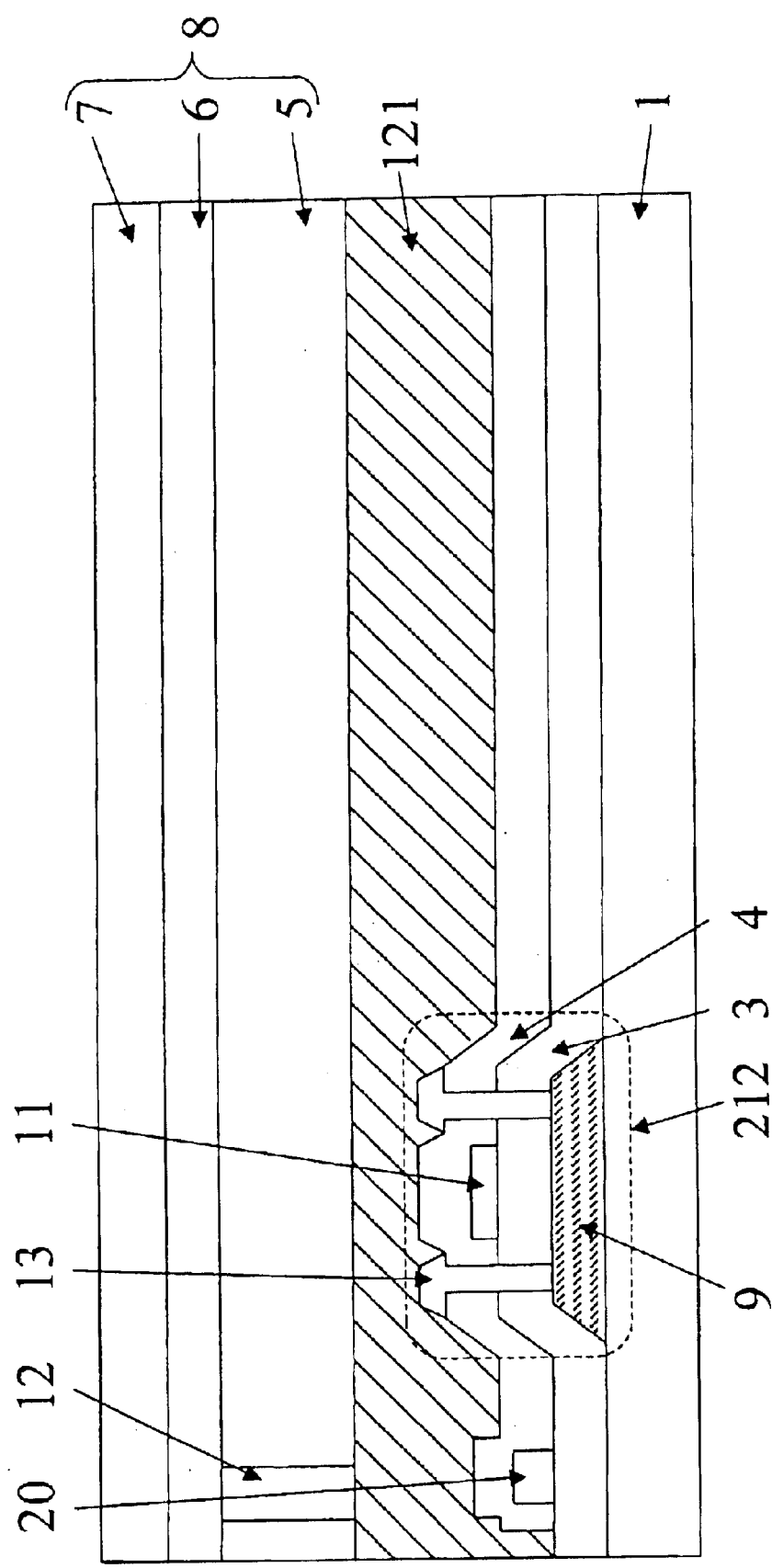
FIG. 15 is a sectional view taken along a line B–B' in FIG. 13.

A luminescent display device of active matrix drive type according to this embodiment includes a switching thin film transistor 211, a current control thin film transistor 212 and an EL device 8 provided on a substrate 1 for each pixel as shown in FIGS. 13 to 15.

The switching thin film transistor 211 and the current control thin film transistor 212 each have substantially the same construction as in Embodiment 1. That is, the thin film transistors 211 and 212 each include an active layer 9 provided on the substrate 1, and a gate electrode 11 provided on the active layer 9 with the intervention of a gate insulating film 3. An interlayer insulating film 4 is provided on the substrate formed with the switching thin film transistor 211 and the current control thin film transistor 212, and an insulating film 121 of a light-shielding material is provided on the interlayer insulating film 4. The insulating film 121 is planarized.

The El device 8 has substantially the same construction as in Embodiment 1.

In the luminescent display device of active matrix drive type, emitted light is outputted from an opposite side of the substrate.

Embodiment 6

Figure 16:
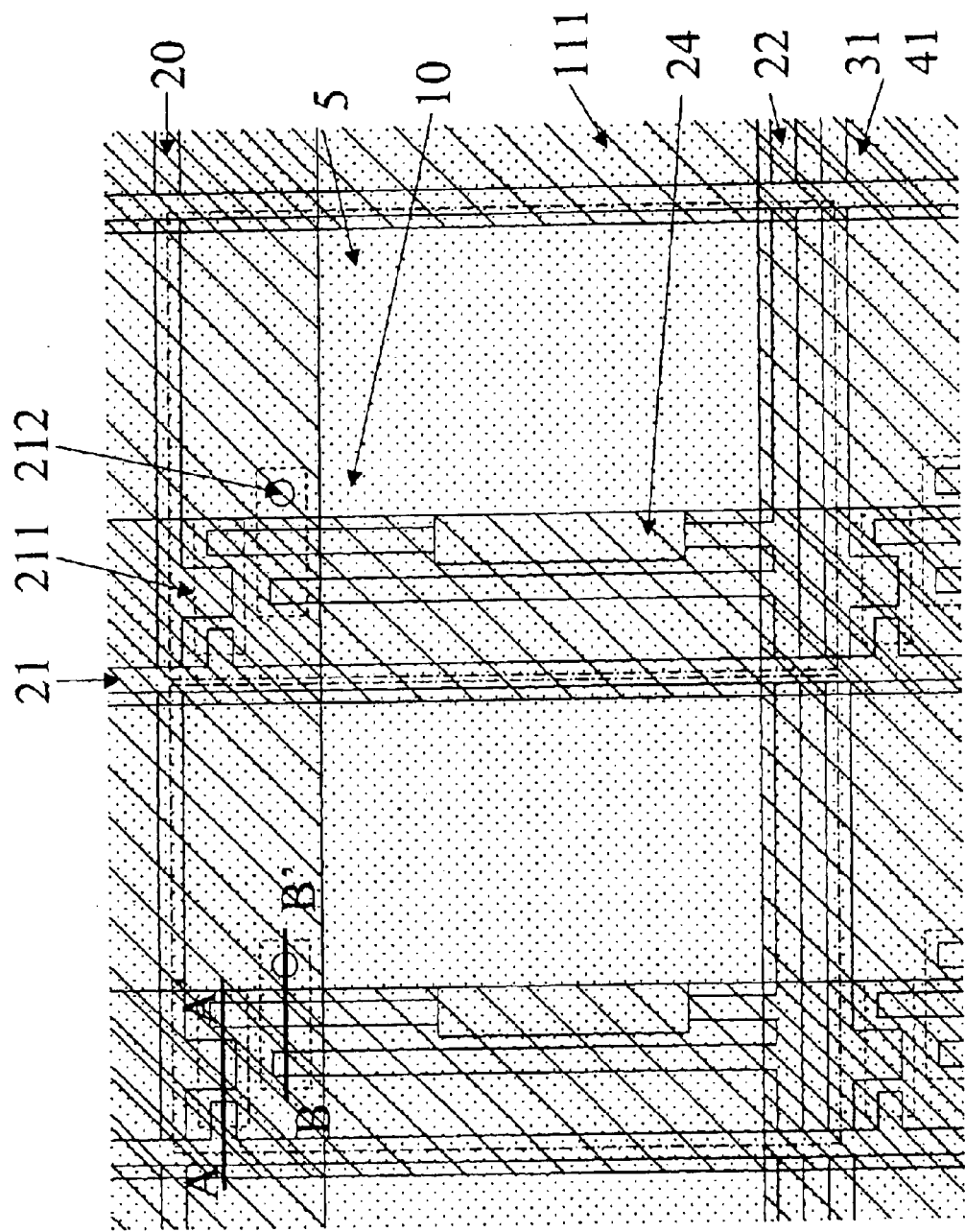
FIG. 16 is a schematic plan view illustrating a luminescent display device of active matrix drive type according to Embodiment 6 of the present invention.
Figure 17:
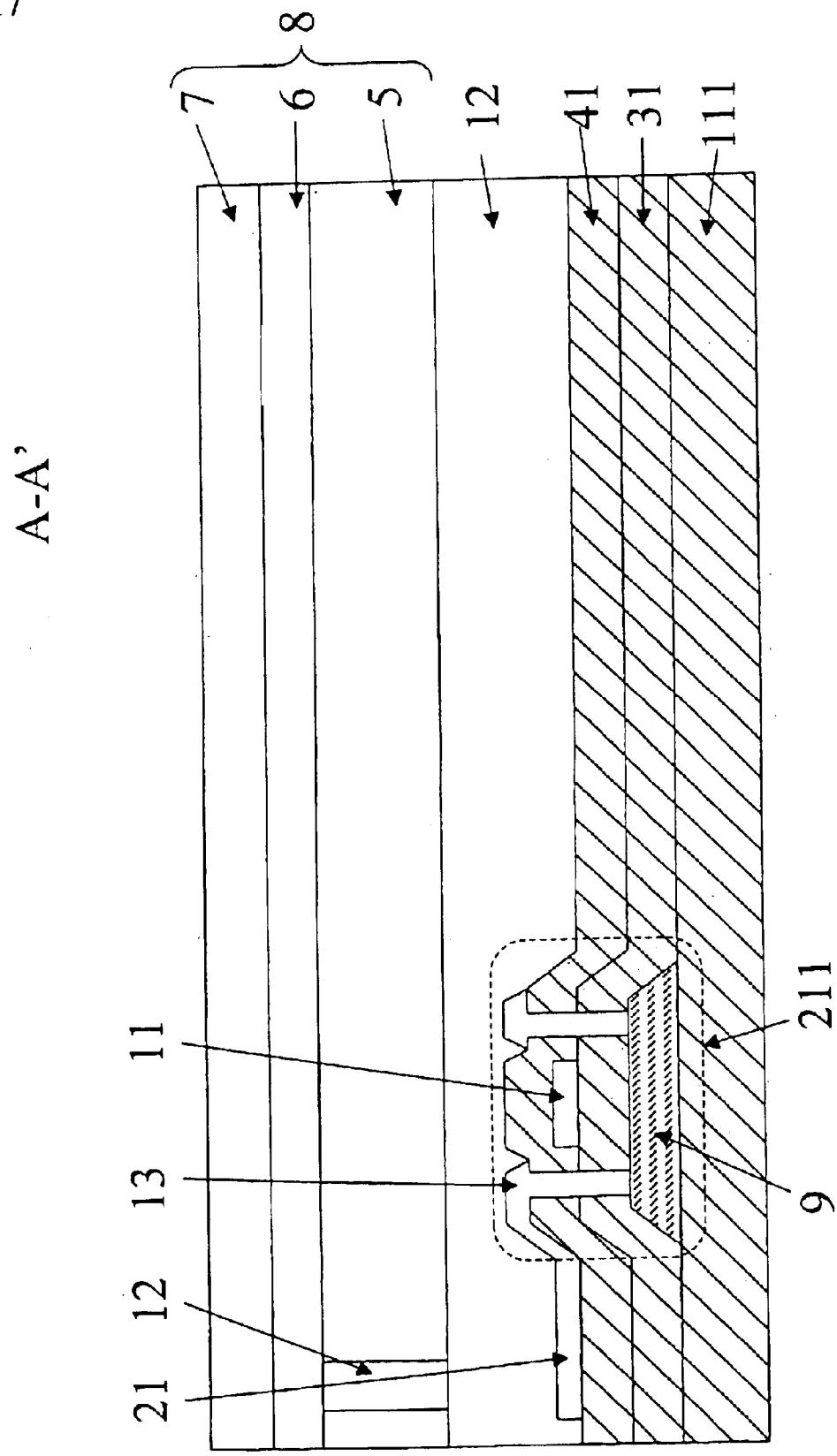
FIG. 17 is a sectional view taken along a line A–A' in FIG. 16.
Figure 18:
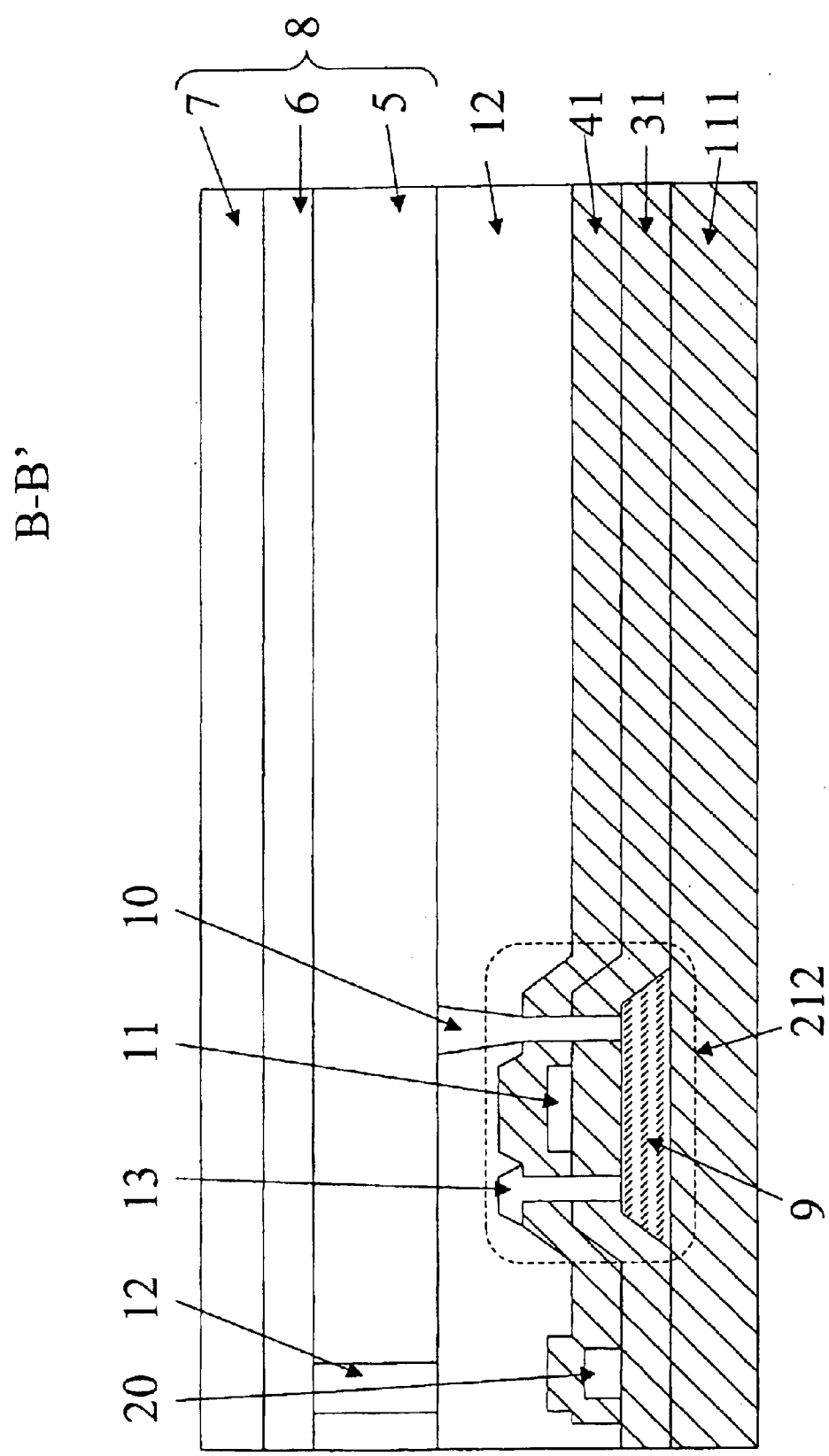
FIG. 18 is a sectional view taken along a line B–B' in FIG. 16.

As shown in FIGS. 16 to 18, a luminescent display device of active matrix drive type according to this embodiment has substantially the same construction as in Embodiment 5, except that a light-proof substrate 111 is employed instead of the substrate 1 for preventing external light incident on the substrate from reaching the switching thin film transistor 211 and the current control thin film transistor 212, that the gate insulating film 31 and the interlayer insulating film 41 are each formed of a light-shielding material, and that the insulating film 12 on the TFTs 211, 212 does not have a light-shielding property.

Embodiment 7

Figure 19:
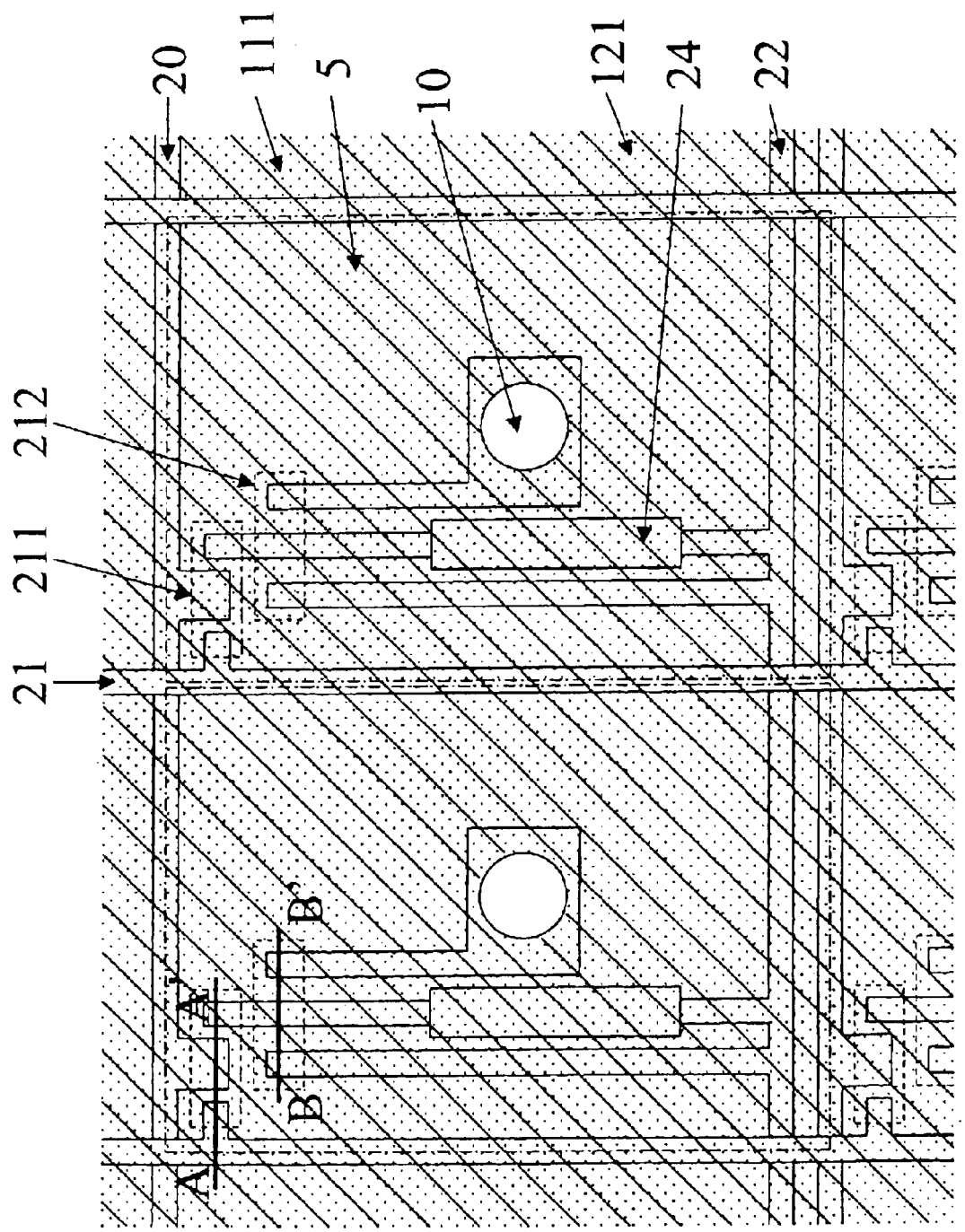
FIG. 19 is a schematic plan view illustrating a luminescent display device of active matrix drive type according to Embodiment 7 of the present invention.
Figure 20:
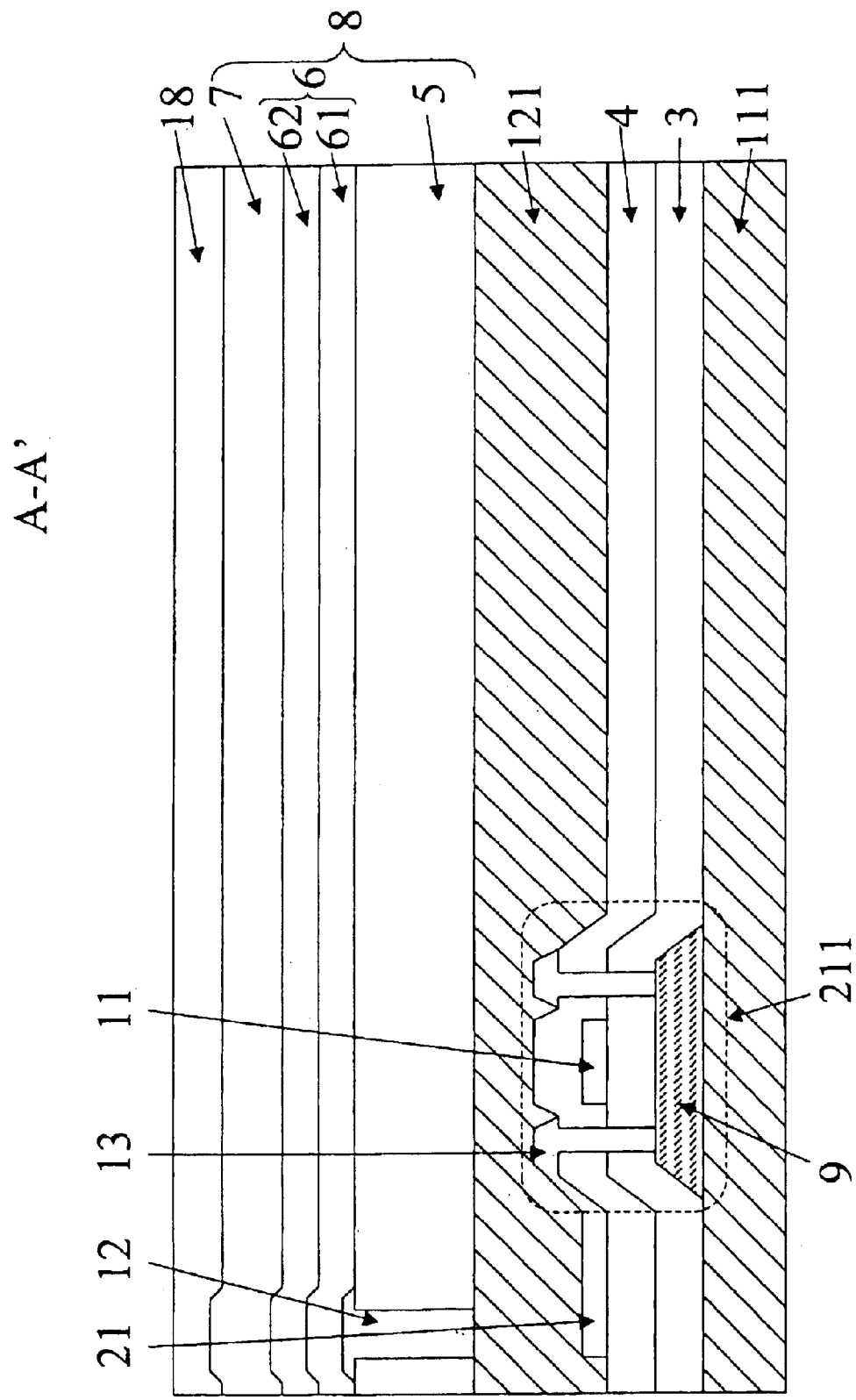
FIG. 20 is a sectional view taken along a line A–A' in FIG. 19.
Figure 21:
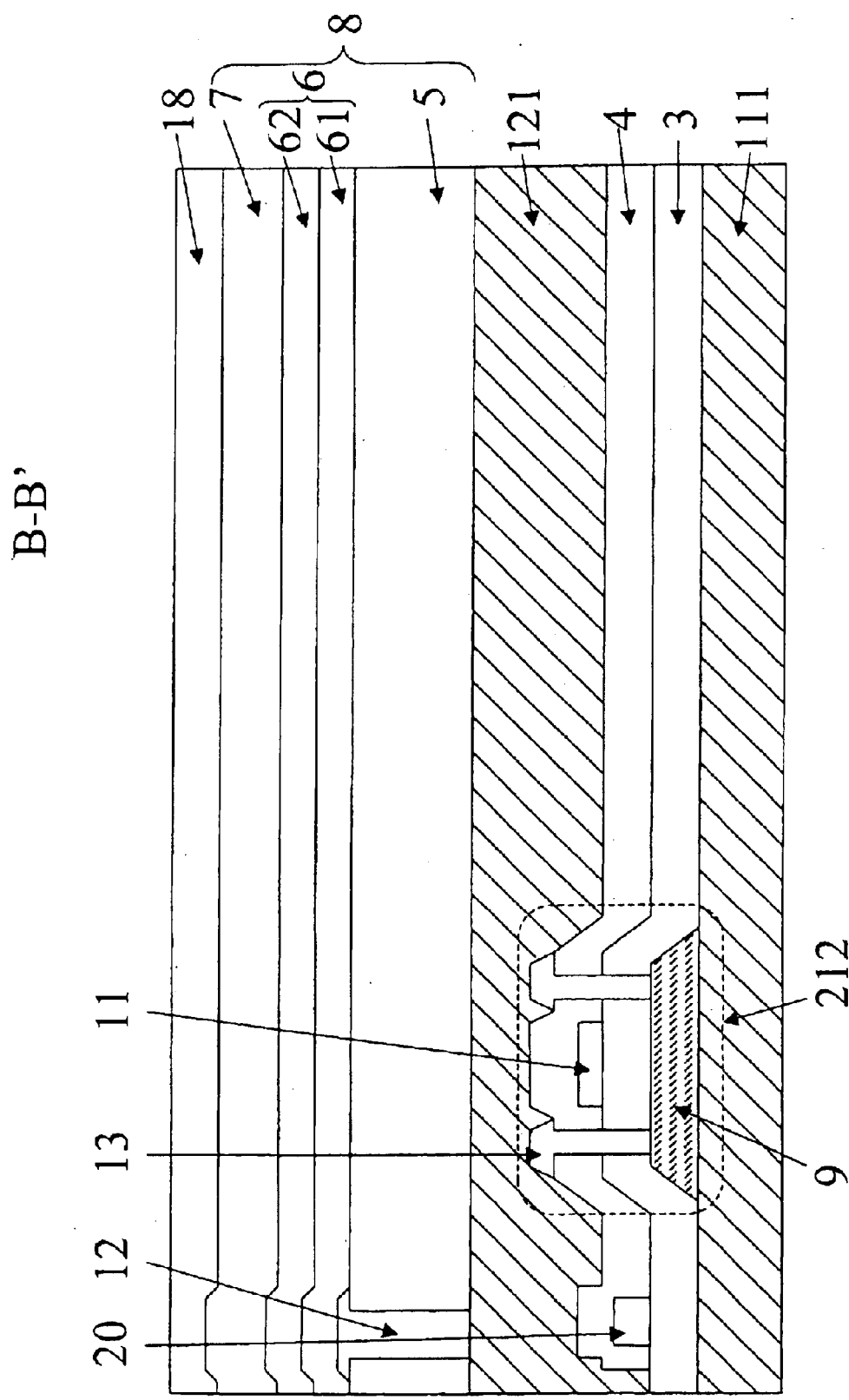
FIG. 21 is a sectional view taken along a line B–B' in FIG. 19.

As shown in FIGS. 19 to 21, a luminescent display device of active matrix drive type according to this embodiment has substantially the same construction as in Embodiment 5, except that a light-proof substrate 111 is employed instead of the substrate 1 for preventing external light incident on the substrate from reaching the switching thin film transistor 211 and the current control thin film transistor 212, that the EL layer 6 includes a hole transporting layer 61 and a red light emitting layer 62, and that a sealing plate 18 is provided on the counter electrode 7.

The luminescent display device was fabricated in the following manner.

An alumina substrate (thickness: 2.0 mm (±3.0%), resistance $>10^{14}\Omega\cdot cm$, moisture content: 0%, gas permeability: 0%, softening point: 1400° C.) was used as a light-proof substrate 111. The light-proof substrate 111 had a transmittance of 0% for the visible spectrum.

A 50-nm thick α-Si film was formed on the light-proof substrate 111 by decomposing $SiH_4$ by an LP-CVD method, and polycrystallized by solid phase epitaxy for formation of a polysilicon film. Then, the polysilicon film was patterned into a predetermined configuration for formation of active layers 9 in which channel regions and source/drain regions of thin film transistors were to be formed. Subsequently, a 100-nm thick gate insulating film of $SiO_2$ was formed by thermal oxidization of the polysilicon film at a temperature not lower than 1000° C.

Thereafter, an Al film was formed on the gate insulating film by a sputtering method and patterned for formation of gate electrodes 11. At the same time, formation of lower electrodes of capacitors was achieved. In turn, side faces of the gate electrodes 11 were subjected to anodic oxidization for formation of offset portions, and the active layers 9 were doped with phosphorus in a high concentration by an ion doping method for the formation of the source/drain regions. After formation of scanning lines 20, a 300-nm thick $SiO_2$ film was formed as an interlayer insulating film 4 over the resulting substrate.

Contact holes were formed in the interlayer insulating film 4, and then source electrodes 13, drain electrodes and common electrodes were formed on the resulting substrate. Further, upper electrodes of the capacitors were formed on the resulting substrate. Thus, the formation of switching thin film transistors 211 and current control thin film transistors 212 was achieved through a high temperature process.

A 2-μm thick inorganic black insulating film was formed as a light-shielding film 121 on the resulting substrate by a sputtering method with the use of an $Ni_{0.7}Zn_{0.3}Fe_2O_4$ target. The light-shielding insulating film 121 had a transmittance of not greater than 2% for the visible spectrum.

Contact holes 10 were formed in the light-shielding insulating film 121 at centers of pixels by a photolithography method for electrical connection between the drain electrodes and pixel electrodes to be formed later. This arrangement ensures uniform current distribution in each of the pixels.

In turn, aluminum was deposited to a thickness of 3 μm on the light-shielding insulating film 121 by a sputtering method, and then the resulting aluminum film and the light-shielding insulating film were polished by 4 μm as measured from the top of the aluminum film. Thus, surfaces of the light-shielding insulating film 121 and aluminum deposited in the contact holes 10 were simultaneously planarized.

A 150-nm thick ITO film was formed on the resulting substrate by a sputtering method for electrical connection to the drain electrodes via the contact holes 10. For the sputtering, the substrate was kept at 300° C. The ITO film was patterned into a predetermined configuration for the formation of the pixel electrodes 5. The pixel electrodes 5 thus formed each had a surface resistance of lower than 10 Ω/□ and a flatness of ±2%.

Then, a tapered insulating film 12 of $SiO_2$ was formed between the pixel electrodes 5. The tapered insulating film prevents degradation of the devices which may otherwise occur due to field concentration at edges of the pixel electrodes.

In turn, NPD was deposited to a thickness of 50 nm on the pixel electrodes 5 by a resistance heating evaporation method for formation of a hole transporting layer 61.

A red transfer plate was bonded onto the hole transporting layer 61, and a 13-W YAG laser was scanned over the red transfer plate so as to be applied to desired portions of the transfer plate for pattern-transferring a red light emitting layer from the transfer plate onto the hole transporting layer 61. A green light emitting layer and a blue light emitting layer were respectively pattern-transferred from a green transfer plate and a blue transfer plate onto the hole transporting layer in substantially the same manner. Thus, light emitting layers 62 were formed.

Prior to the pattern transfer, the red transfer plate was prepared in the following manner. A thermosetting epoxy resin containing carbon particles was applied to a thickness of 5 μm on a 0.1-mm thick polyethylene terephthalate base film and cured at a room temperature for formation of a laser-to-heat converting layer. Then, a 1-μm thick poly(α-methylstyrene) film was formed as a heat conducting and releasing layer on the laser-to-heat converting layer, and $Alq_3$ and DCM2 were deposited to a thickness of 70 nm on the heat conducting and releasing layer by coevaporation thereof for formation of the red light emitting layer.

The green transfer plate was prepared in the following manner. A thermosetting epoxy resin containing carbon particles was applied to a thickness of 5 μm on a base film as described above and cured at a room temperature for formation of a laser-to-heat converting layer. Then, a 1-μm thick poly (α-methylstyrene) film was formed as a heat conducting and releasing layer on the laser-to-heat converting layer, and $Alq_3$ was deposited to a thickness of 70 nm on the heat conducting and releasing layer by evaporation thereof for formation of the green light emitting layer.

The blue transfer plate was prepared in the following manner. A thermosetting epoxy resin containing carbon particles was applied to a thickness of 5 μm on a base film as described above and cured at a room temperature for formation of a laser-to-heat converting layer. Then, a 1-μm thick poly (α-methylstyrene) film was formed as a heat conducting and releasing layer on the laser-to-heat converting layer, and DPVBi was deposited to a thickness of 70 nm on the heat conducting and releasing layer by evaporation thereof for formation of the blue light emitting layer.

Then, Al and Li were deposited to a thickness of 50 nm by coevaporation thereof for formation of translucent counter electrodes 7.

Subsequently, an epoxy resin was applied to a thickness of 1 μm over the counter electrodes by spin coating for formation of a sealing plate 18.

When scanning signals were sequentially applied to the scanning lines after a power source was connected to the signal lines of the luminescent display device of active matrix drive type thus fabricated, light emission from every pixel was observed without luminous inconsistency. Even after the display device was continuously driven in a dark room for 100 hours, no cross-talk was observed. Further, luminescent characteristics of the display device were evaluated after the display device was left under a 300-lux fluorescent light for 100 hours and, as a result, no cross-talk was observed.

Embodiment 8

Figure 22:
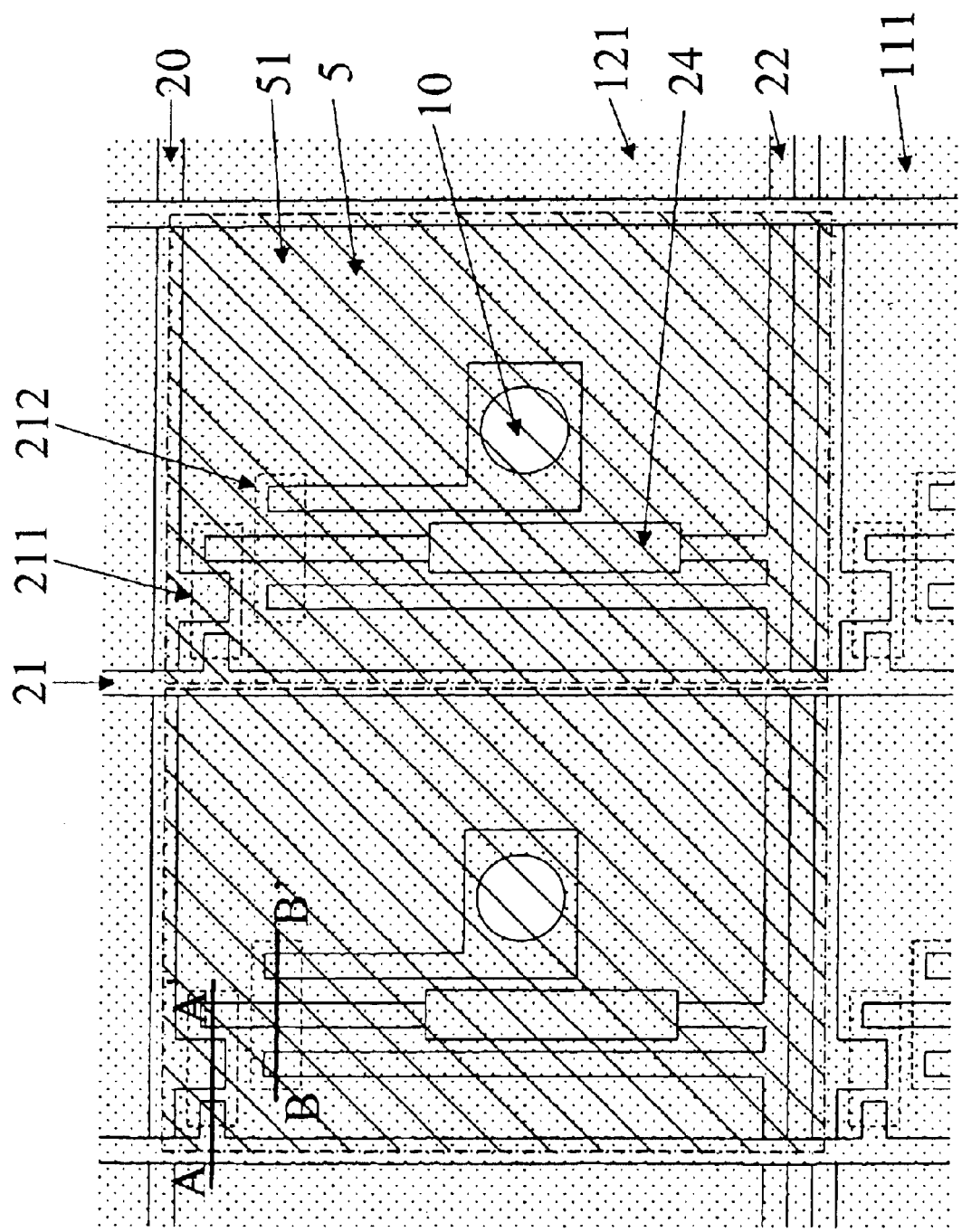
FIG. 22 is a schematic plan view illustrating a luminescent display device of active matrix drive type according to Embodiment 8 of the present invention.
Figure 23:
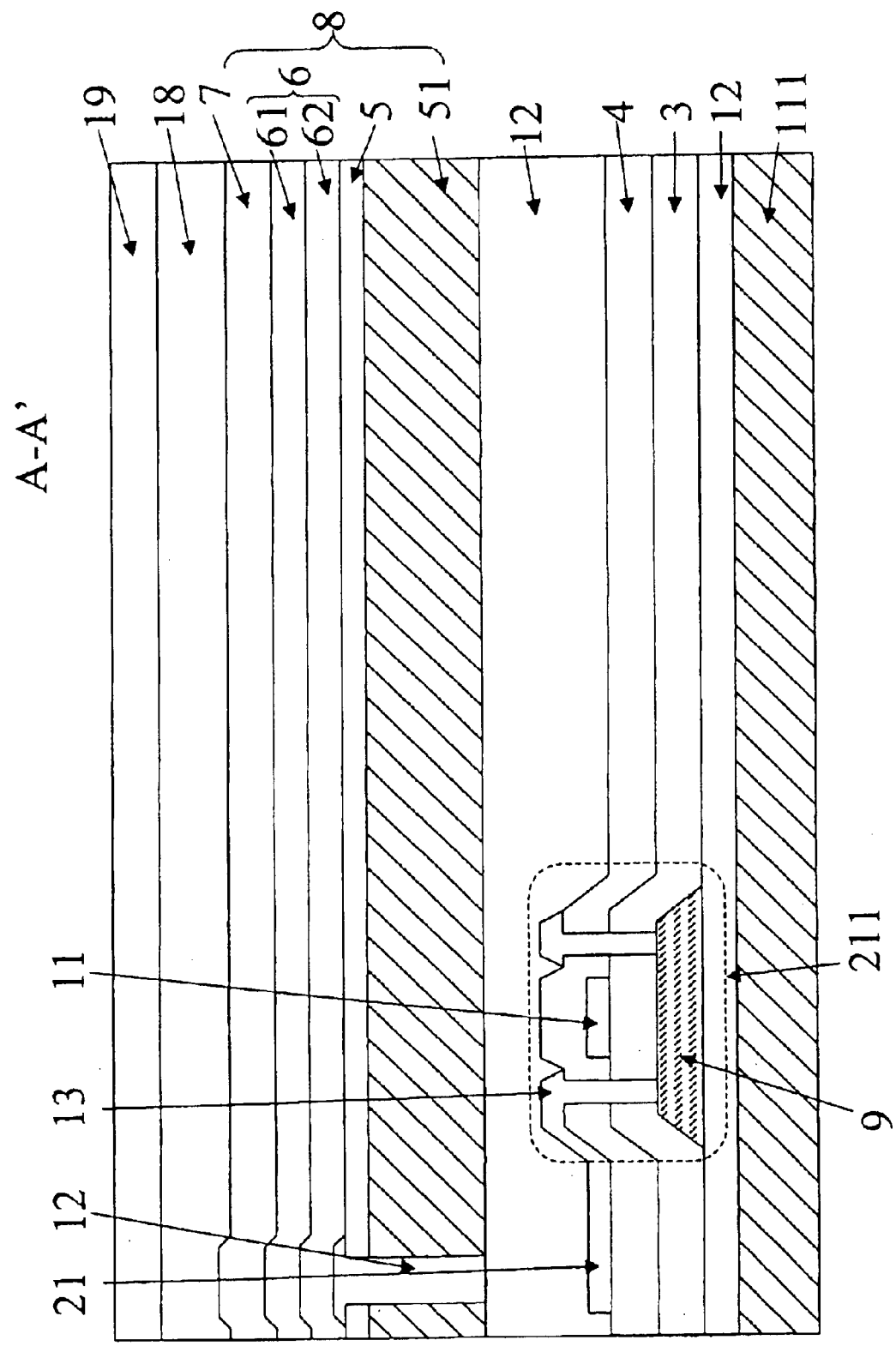
FIG. 23 is a sectional view taken along a line A–A' in FIG. 22.
Figure 24:
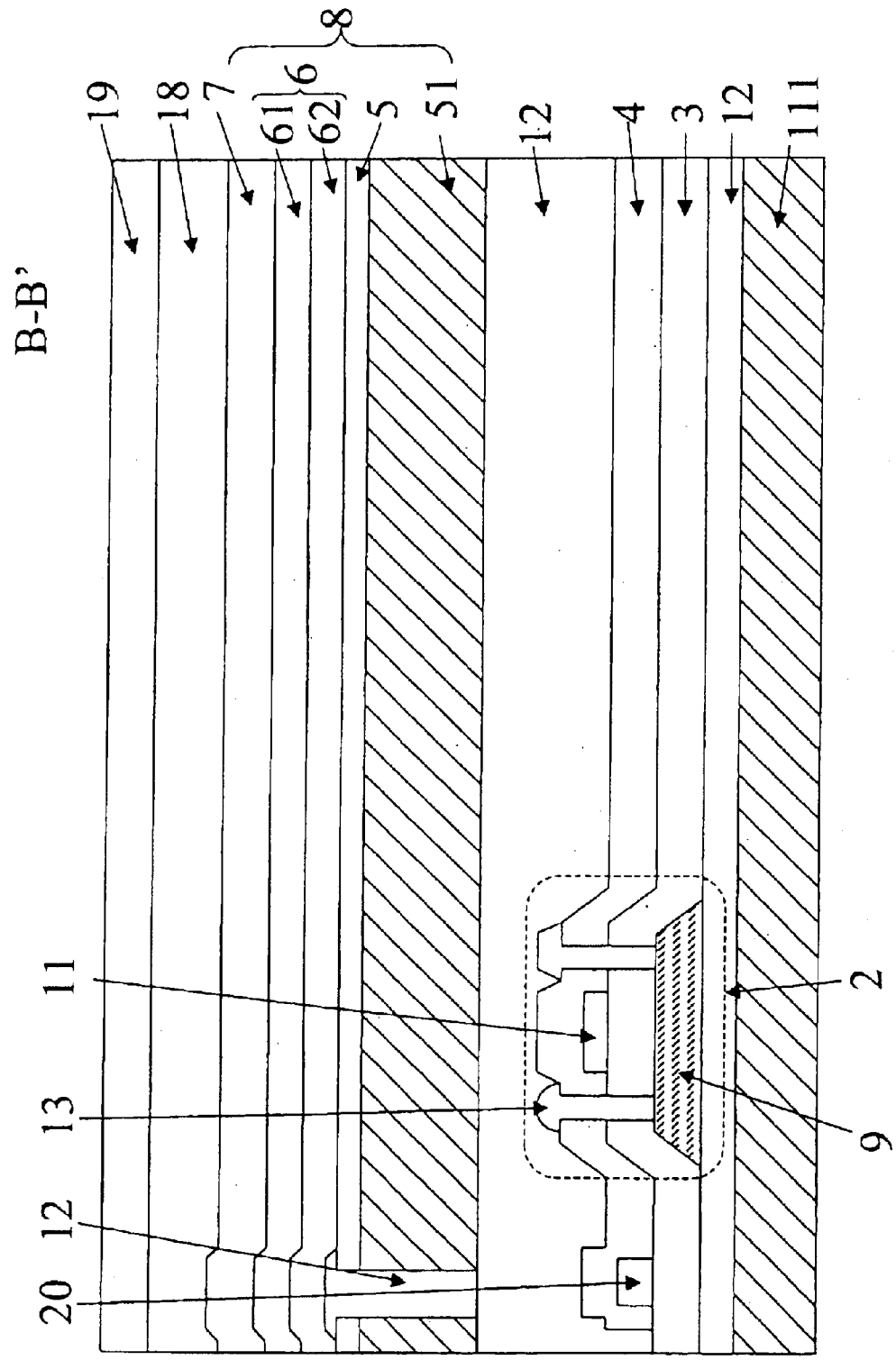
FIG. 24 is a sectional view taken along a line B–B' in FIG. 22.

As shown in FIGS. 22 to 24, a luminescent display device of active matrix drive type according to this embodiment has substantially the same construction as in Embodiment 7, except that the switching thin film transistor 211 and the current control thin film transistor 212 are provided on the light-proof substrate 111 with the intervention of an insulating film 12, that another insulating film 12 is provided on the interlayer insulating film 4 for planarization, that the hole transporting layer 61 is provided on the light emitting layer 62 in the EL layer, and that a light-shielding pixel electrode 51 is provided below the pixel electrode 5.

The luminescent display device was fabricated in the following manner.

An aluminum substrate (thickness: 1.2 mm (±5.0%), resistance >2.7×10⁻⁶ Ω·cm, moisture content: 0%, gas permeability: 0%, softening point: 660° C.) was employed as a light-proof substrate 111. A surface of the light-proof substrate 111 was subjected to anodic oxidation for formation of an $Al_2O_3$ insulating film 12 (thickness: 150 nm (±5.0%), resistance >$10^{14}$ Ω·cm, softening point: 1400° C.).

TFTs 211 and 212 were formed on the resulting substrate in the same manner as in Embodiment 7.

For formation of an insulating film 12, a photosensitive acrylic resin was applied to a thickness of 2 μm over the resulting substrate by a spin coating method and a 1-μm thick $SiO_2$ film was formed thereon by a sputtering method. Contact holes 10 were formed in the insulating film 12 at centers of pixels for electrical connection between the drain electrodes and pixel electrodes to be formed later. This arrangement ensures uniform current distribution in each of the pixels.

In turn, silver was deposited to a thickness of 5 μm on the resulting substrate by a sputtering method for formation of light-shielding pixel electrodes 51, which were in turn polished by 4 μm for planarization thereof. Calcium was deposited to a thickness of 20 nm on the light-shielding pixel electrode 51 by a resistance heating evaporation method, and patterned for formation of pixel electrodes 5. The light-shielding pixel electrodes 51 each had a transmittance of not greater than 3% for the visible spectrum.

Then, a tapered insulating film 12 of $SiO_2$ was formed between the pixel electrodes 5.

A red transfer plate was bonded onto the pixel electrodes 5, and a 13-W YAG laser was scanned over the red transfer plate so as to be applied to desired portions of the transfer plate for pattern-transferring a red light emitting layer from the transfer plate selectively onto the pixel electrodes 5. A green light emitting layer and a blue light emitting layer were respectively pattern-transferred from a green transfer plate and a blue transfer plate selectively onto the pixel electrodes 5 in substantially the same manner. Thus, light emitting layers were formed. The laser transfer method makes it possible to from the light emitting layers 62 of the polymeric light emitting materials even on the Ca pixel electrodes which are reactive with a solvent.

In turn, a hole transporting layer transfer plate was bonded onto the light emitting layers 62, and a 13-W YAG laser was scanned over the hole transporting layer transfer plate so as to be applied to desired portions of the transfer plate for pattern-transferring a hole transporting layer 61 from the transfer plate onto the light emitting layers 62.

Prior to the pattern transfer, the red transfer plate was prepared in the following manner. A chloroform solution of MEH—PPV was applied onto a base film having a heat conducting and releasing layer formed thereon in the same manner as in Embodiment 7, and dried for formation of a 70-nm thick red light emitting layer. Then, the resulting film was baked at 80° C. in vacuo for one hour. The heat-withstanding temperature of MEH—PPV was 180° C. The term "heat-withstanding temperature" herein means a highest possible temperature which does not deteriorate the electrical characteristics of the devices when the devices are heated for drying thereof in a fabrication process with the use of that material.

The green transfer plate was prepared in the following manner. A chloroform solution of PPV was applied onto a base film having a heat conducting and releasing layer formed thereon in the aforesaid manner, and dried for formation of a 70-nm thick green light emitting layer. Then, the resulting film was baked at 80° C. in vacuo for one hour. The heat-withstanding temperature of PPV was 240° C.

The blue transfer plate was prepared in the following manner. A xylene solution of PDAF was applied onto a base film having a heat conducting and releasing layer formed thereon in the aforesaid manner, and dried for formation of a 70-nm thick blue light emitting layer. Then, the resulting film was baked at 80° C. in vacuo for one hour. The heat-withstanding temperature of PFO was 240° C.

The hole transporting layer transfer plate was prepared in the following manner. A PEDT/PSS aqueous solution was applied onto a base film having a heat conducting and releasing layer formed thereon in the aforesaid manner, and dried for formation of a 50-nm thick hole transporting layer. Then, the resulting film was baked at 80° C. in vacuo for one hour. The heat-withstanding temperature of PEDT/PSS was 200° C.

Then, the resulting substrate was baked at 100° C. for 10 minutes.

Subsequently, a 150-nm thick ITO film was formed over the resulting substrate by a D.C. reactive sputtering method having an active gas controlling function for formation of counter electrodes 7. In this sputtering method, the formation of a lower resistance ITO film can be achieved at a temperature not higher than 100° C. (which is not higher than the heat-withstanding temperatures of the materials herein used), thereby preventing a damage to the EL layers 6. The counter electrodes 7 thus formed each had a surface resistance of lower than 15 Ω/□, a transmittance of higher than 80% at 550 nm, and a flatness of ±2%.

Then, an epoxy resin was applied to a thickness of 1 $\mu$m over the counter electrodes 7 by spin coating for formation of a sealing plate 18, and a polarization plate 19 was bonded onto the sealing plate 18.

When scanning signals were sequentially applied to the scanning lines after a power source was connected to the signal lines of the luminescent display device of active matrix drive type thus fabricated, light emission from every pixel was observed without luminous inconsistency. Even after the display device was continuously driven in a dark room for 100 hours, no cross-talk was observed. Further, luminescent characteristics of the display device were evaluated after the display device was left under a 300-lux fluorescent light for 100 hours and, as a result, no cross-talk was observed.

Embodiment 9 (Driving circuit)

Figure 25:
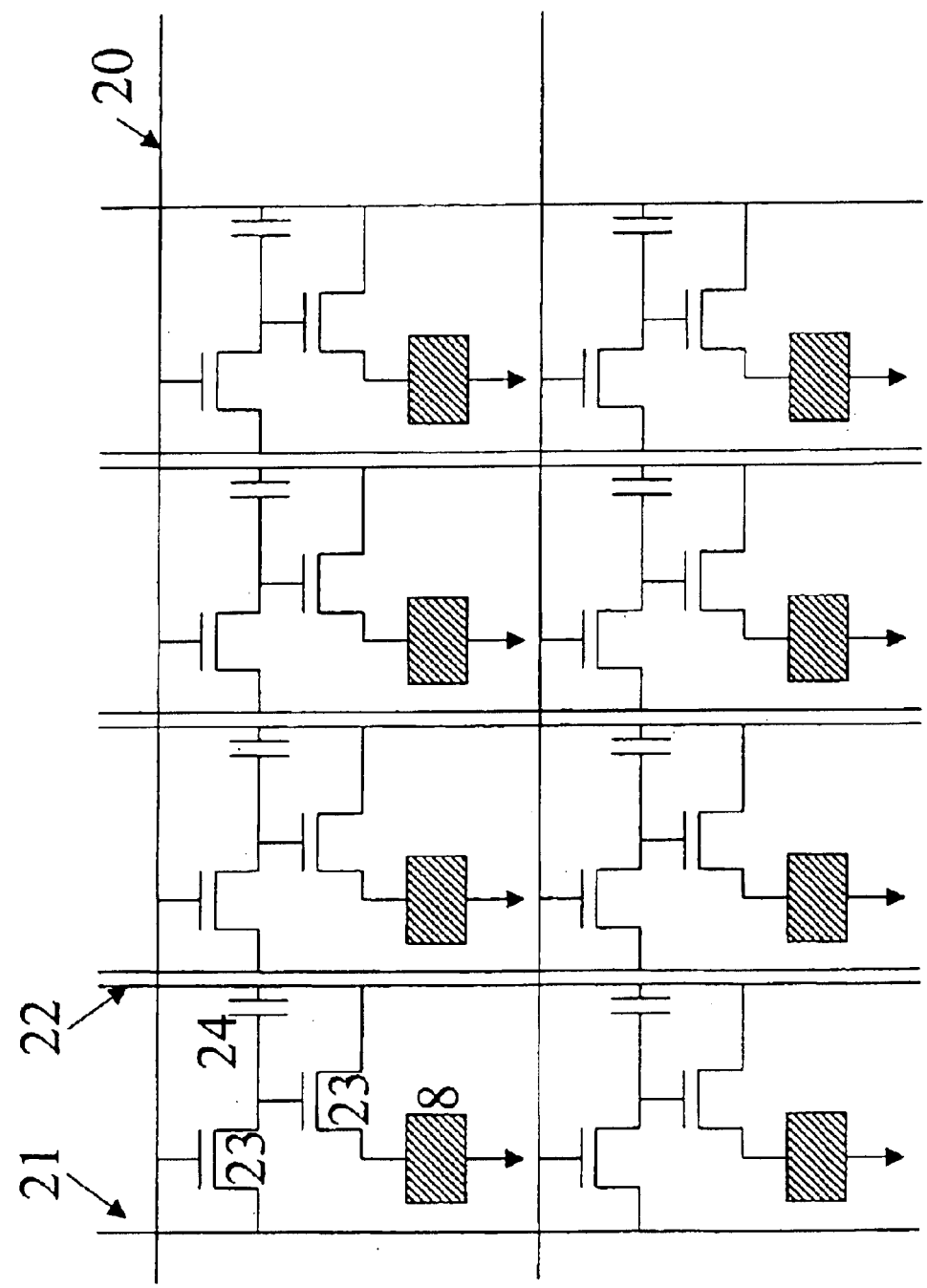
FIG. 25 is an equivalent circuit diagram for the luminescent display devices of active matrix drive type according to the present invention.

In this embodiment, the luminescent display devices of active matrix drive type according to Embodiments 1 to 8 are each arranged so as to have a circuit construction as shown in FIG. 25.

In FIG. 25, two TFTs 23 and one capacitor 24 are employed in combination for driving an LED device 8 in each pixel. The TFTs 23 and the capacitor 24 are connected to a scanning line 20, a signal line 21 and a common line 22.

Embodiment 10 (Driving circuit)

Figure 26:
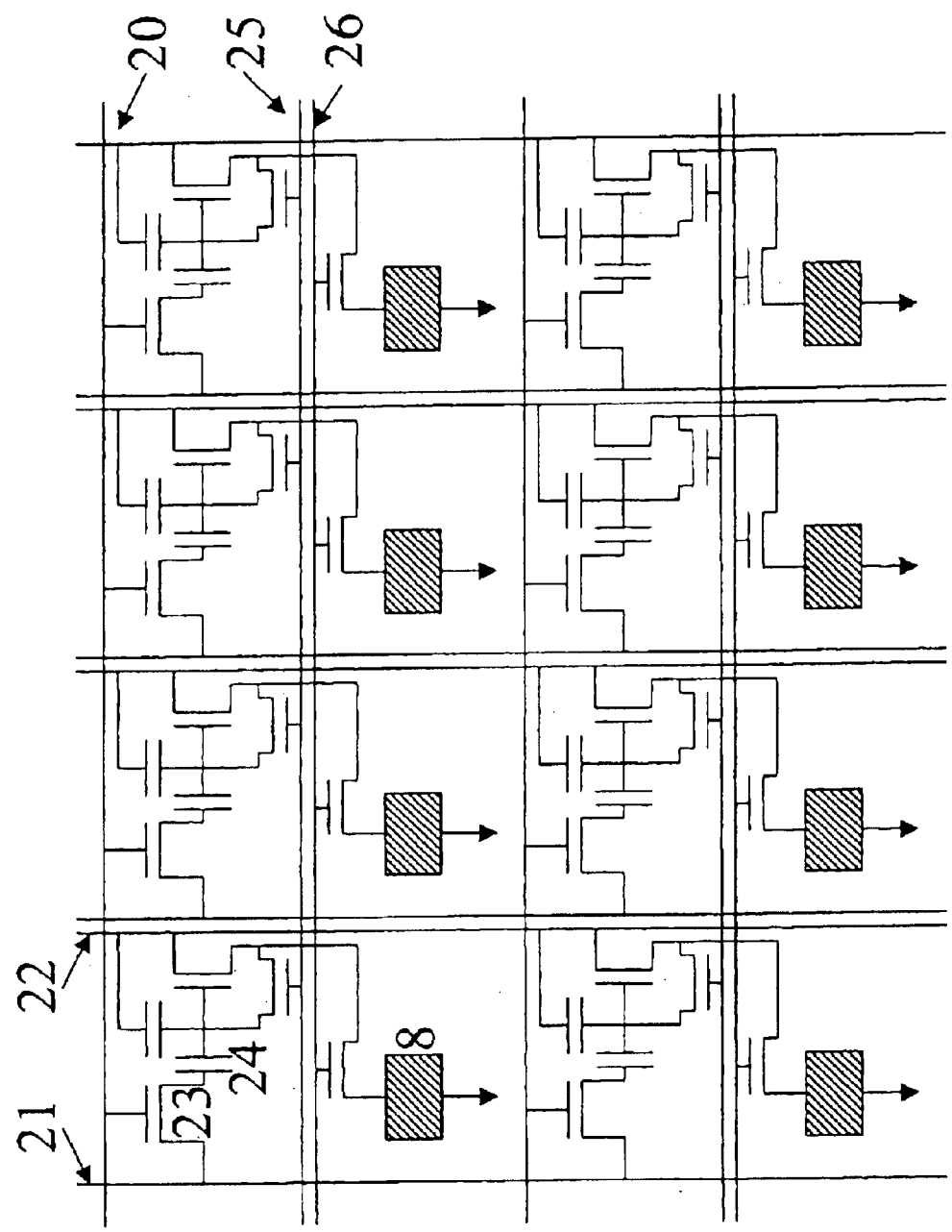
FIG. 26 is another equivalent circuit diagram for the luminescent display devices of active matrix drive type according to the present invention.
Figure 27:
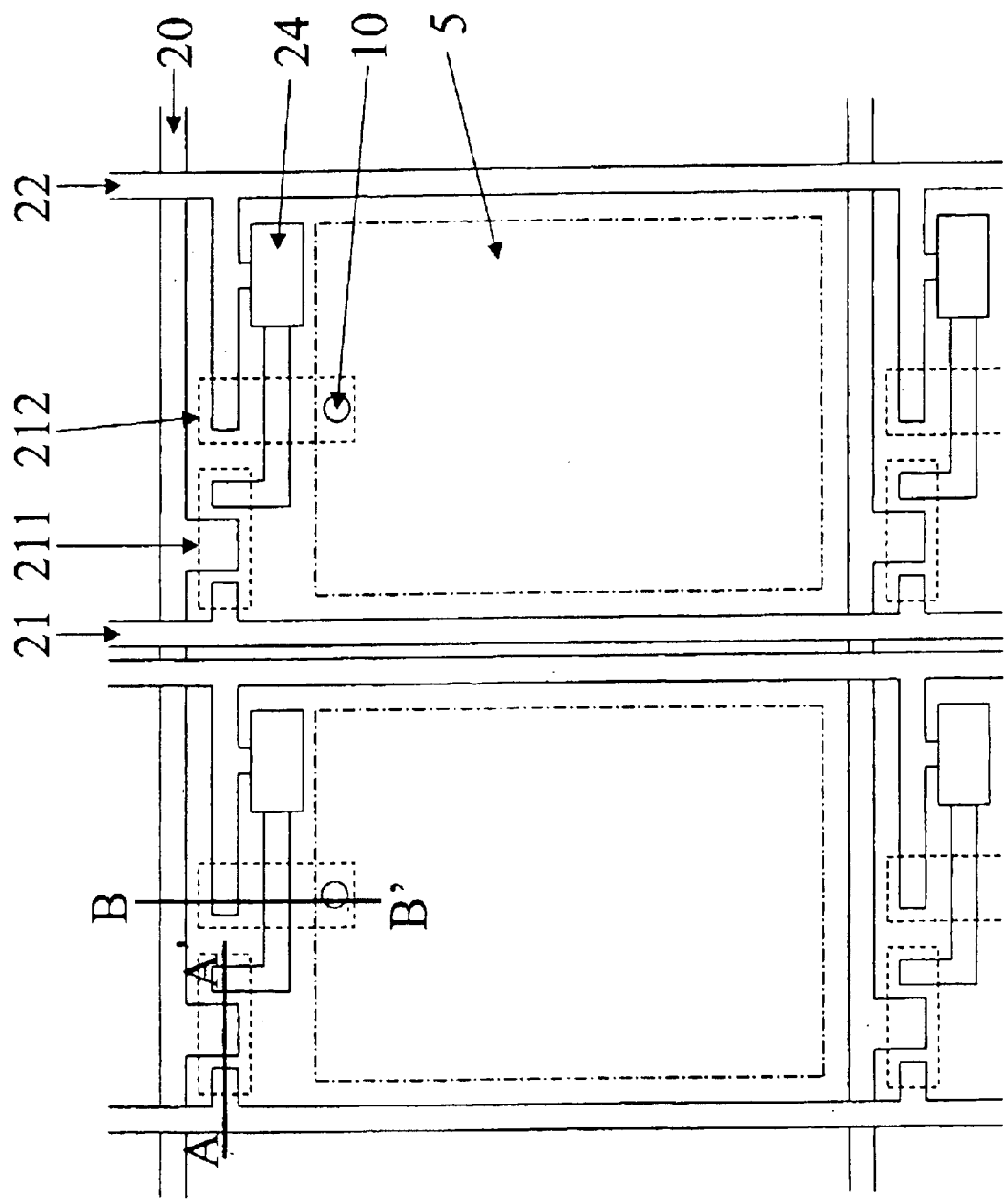
FIG. 27 is a schematic plan view illustrating a luminescent display device of active matrix drive type according to the prior art.
Figure 28:
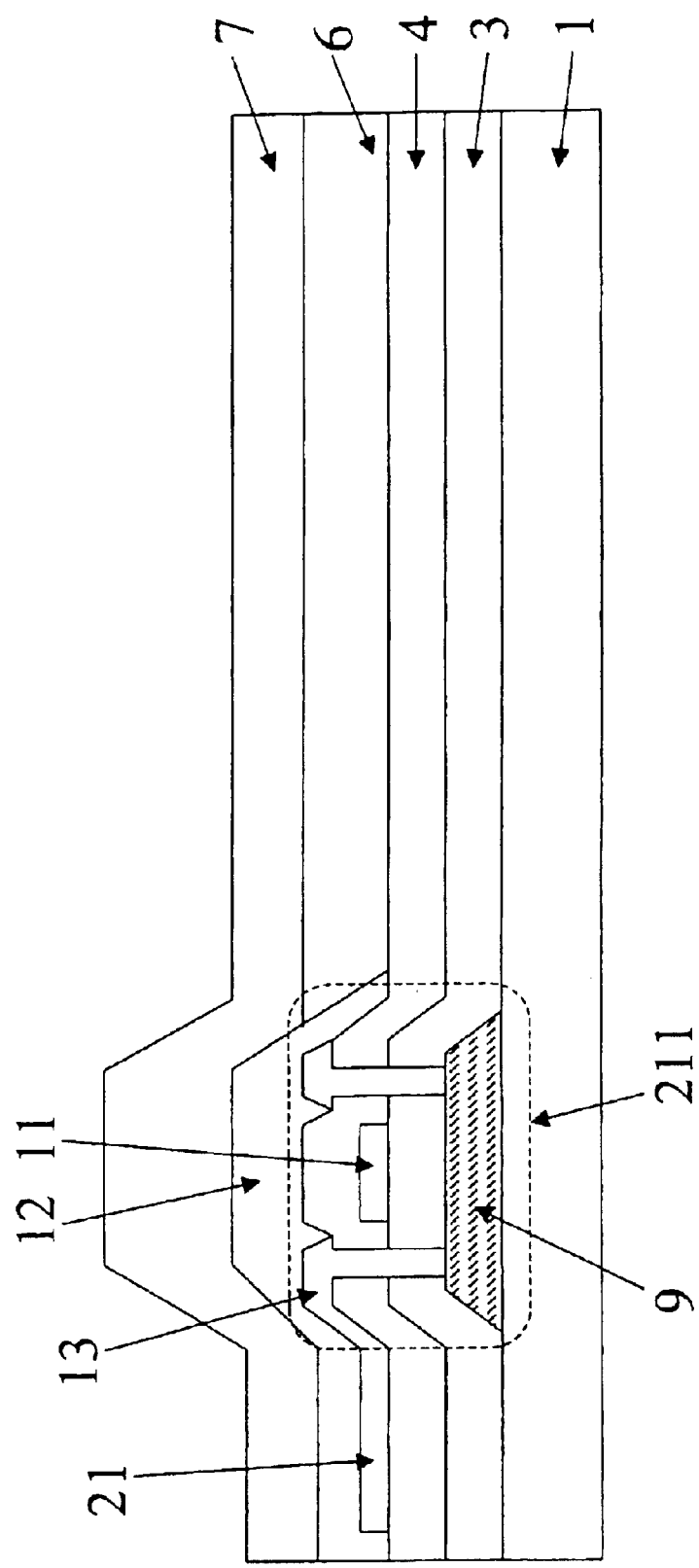
FIG. 28 is a sectional view taken along a line A–A' in FIG. 27.
Figure 29:
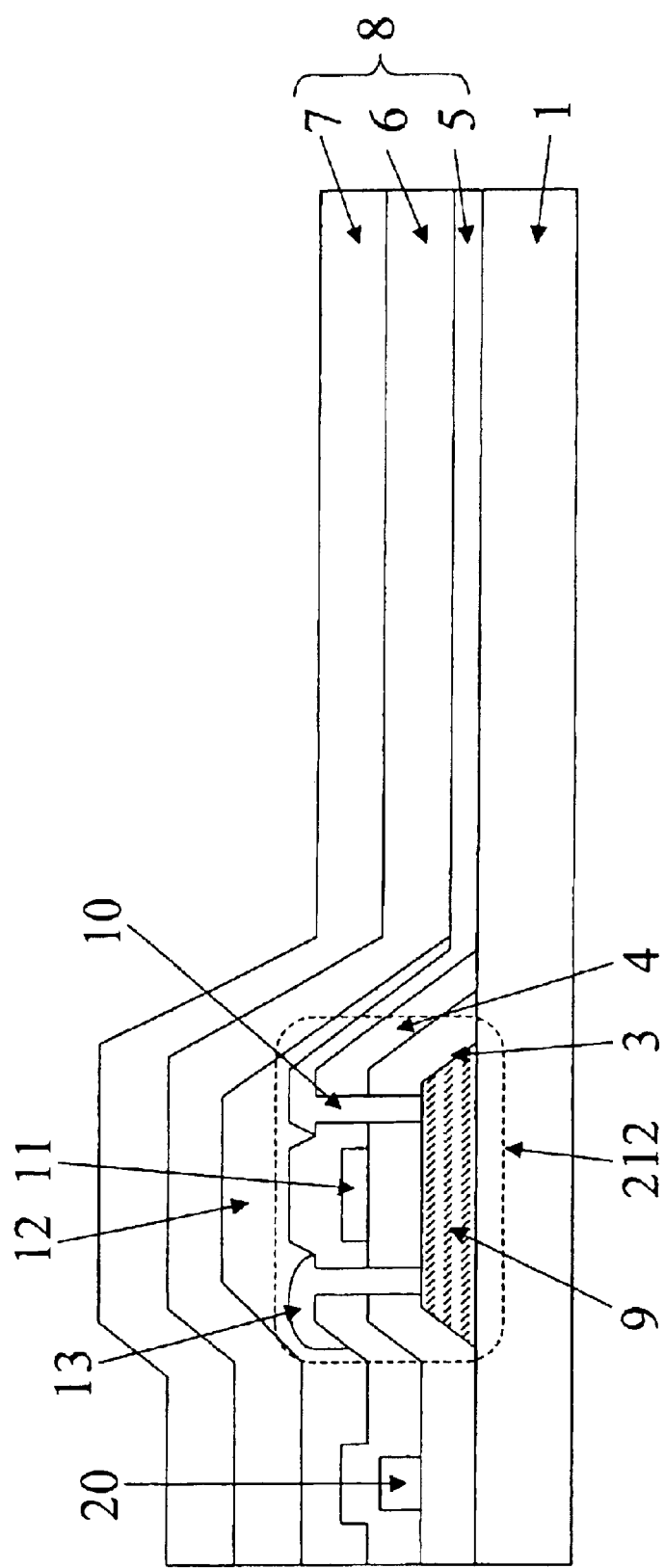
FIG. 29 is a sectional view taken along a line B–B' in FIG. 27.
Figure 30:
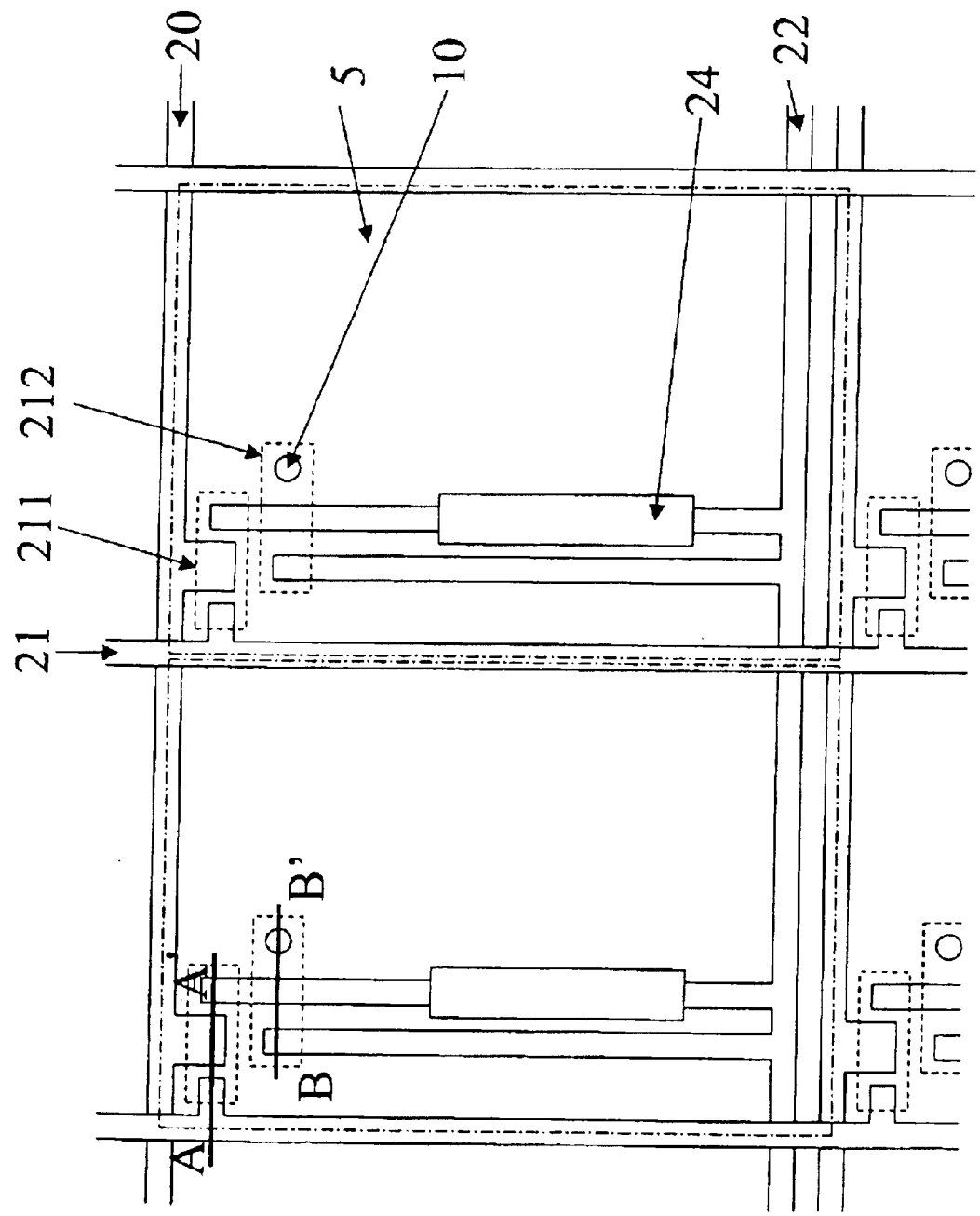
FIG. 30 is a schematic plan view illustrating another luminescent display device of active matrix drive type according to the prior art.
Figure 31:
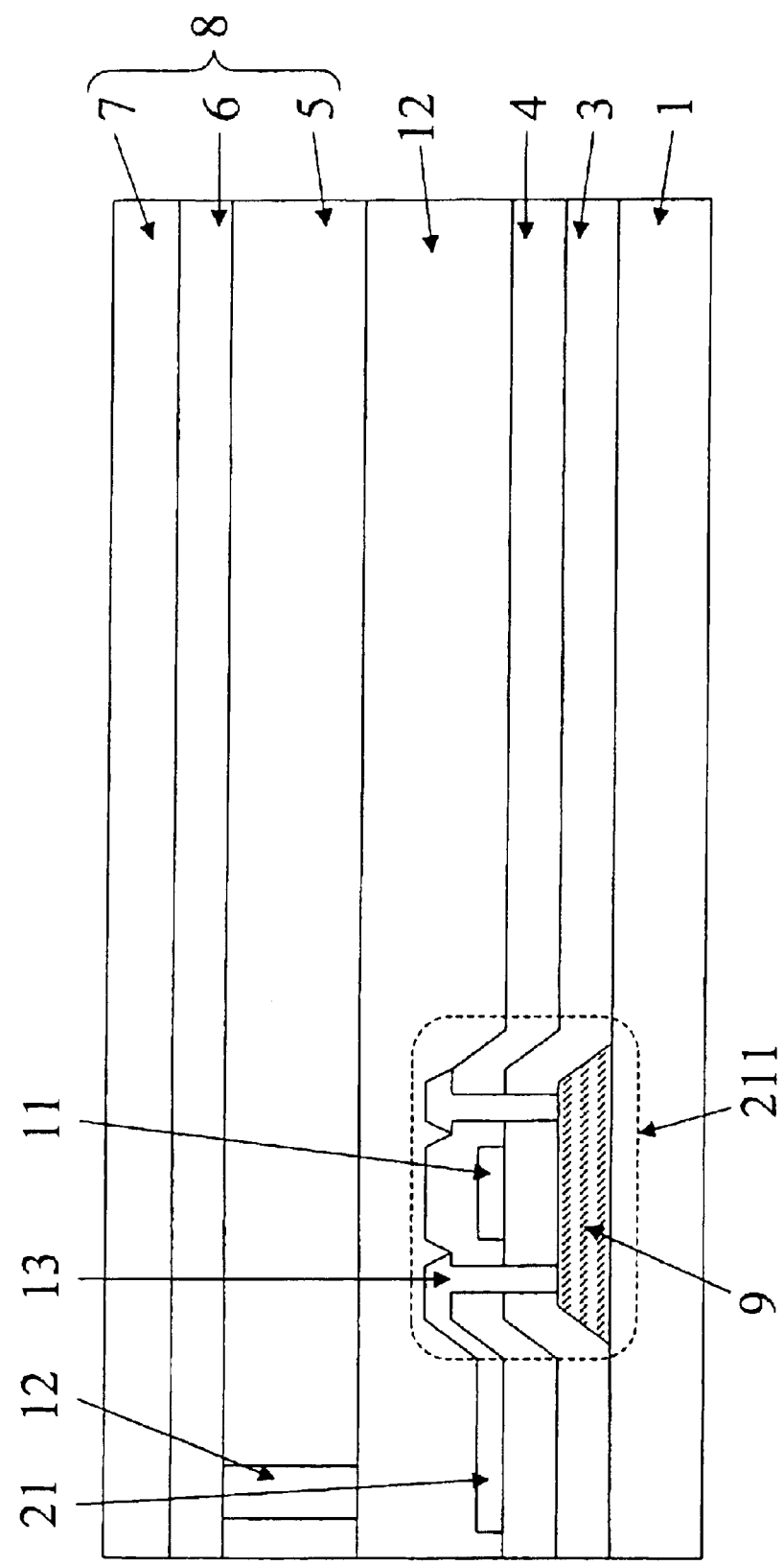
FIG. 31 is a sectional view taken along a line A–A' in FIG. 30.
Figure 32:
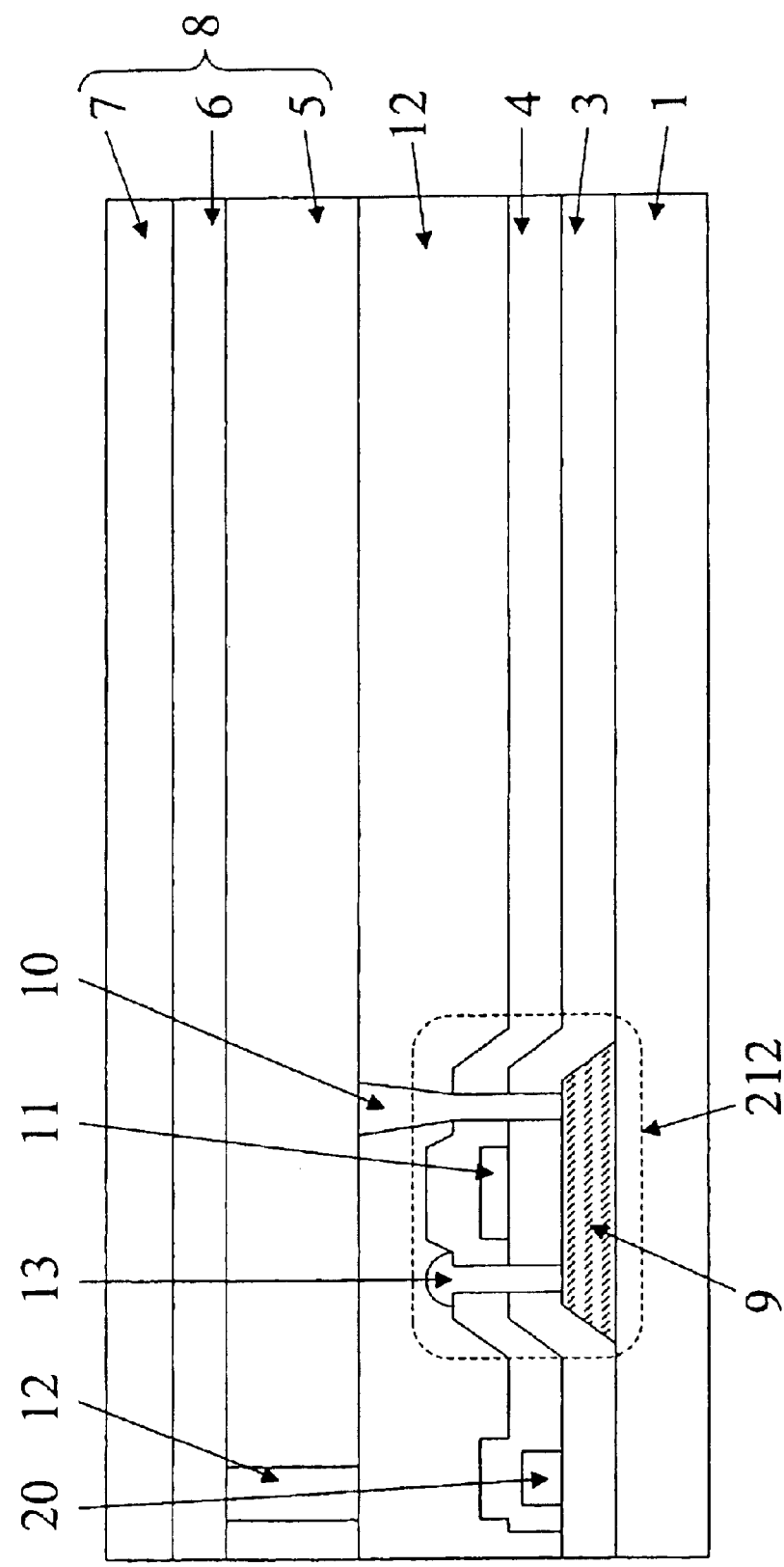
FIG. 32 is a sectional view taken along a line B–B' in FIG. 30.

In this embodiment, the luminescent display devices of active matrix drive type according to Embodiments 1 to 8 are each arranged so as to have a circuit construction as shown in FIG. 26.

In FIG. 26, four TFTs 23 and two capacitors 24 are employed in combination for driving an LED device 8 in each pixel. The TFTs 23 and the capacitors 24 are connected to a scanning line 20, a signal line 21, a common line 22, a first drive line 25, and a second drive line 26.

In accordance with the present invention, the light-shielding layer is provided for preventing the light emitted from the EL devices from reaching the thin film transistors and, therefore, the alteration or deterioration of the electrical characteristics of the semiconductor layers (the active layers of the thin film transistors) can be prevented which may otherwise occur due to incidence of the light emitted from the EL devices on the thin film transistors which are employed for the active matrix driving. As a result, the alteration of the pixels, the cross-talk and the increase in power consumption can be avoided which may otherwise occur due to the increase in leak current attributed to the alteration or deterioration of the semiconductor layers.

Particularly, where the light-shielding layer is capable of absorbing or reflecting at least light of a specific wavelength emitted from the light emitting layers of the electroluminescent layers and is provided between the active layers of the thin film transistors and the EL devices as covering the active layers, the light emitted from the EL devices can effectively be prevented from reaching the thin film transistors.

Where the light-shielding layer is embodies as the insulating layer provided above the thin film transistors or above the thin film transistors and the peripheral regions thereof, the alteration and deterioration of the characteristics of the thin film transistors can be prevented. Further, a plurality of thin film transistors can be arranged without consideration of the aperture ratio, so that the layout of the thin film transistors can more flexibly be designed.

Where the light-shielding layer is embodies as the gate insulating films of the thin film transistors, as the interlayer insulating film provided between the thin film transistors and the electroluminescent layers or as the pixel electrodes, the light emitted from the EL devices can effectively be prevented from reaching the thin film transistors with no need for providing an additional light-shielding layer.

Particularly, where the light-shielding layer is composed of a black inorganic insulation material or a resin material containing a black pigment or dye dispersed therein, the light-shielding layer has a sufficiently reduced transmittance with respect to the emitted light.

Where the light-shielding layer is provided for preventing external light from reaching the thin film transistors and, particularly, provided below the thin film transistors or below the thin film transistors and the peripheral regions thereof, the alteration and deterioration of the semiconductor layers can be prevented which may otherwise occur due to the external light. Therefore, the thin film transistors in the display device have more excellent characteristics.

Where the substrate is a ceramic or metal substrate coated with an insulation material or a metal substrate having a surface subjected to an insulating treatment, incidence of the external light can effectively be prevented with no need for providing an additional light-shielding layer for the prevention of the external light incidence. In addition, the formation of the thin film transistors can be achieved through a high temperature process without the need for employing an expensive quartz substrate or the like.

Where at least one of the insulating film, the gate insulating film and the interlayer insulating film is a layer composed of a resin material and the inorganic insulating film is provided between the resin layer and the thin film transistors and/or the substrate or between the resin layer and the pixel electrodes, the degradation of the thin film transistors and the pixel electrodes can be prevented which may otherwise occur due to moisture contained in the resin material.

In the method for fabricating the luminescent display device of active matrix drive type according to the present invention, the at least one light emitting layer of the electroluminescent layer is formed by the evaporation method, the laser transfer method or the printing method, so that the formation of the light emitting layer can be achieved on a patterned basis. With this fabrication method, full color displays can easily be manufactured at lower costs.

What is claimed is:

1. A luminescent display device of active matrix drive type comprising:
   a substrate;
   a switching thin film transistor, a current control thin film transistor, a capacitor, a signal line, a scanning line and a common line which are provided on the substrate;
   an electroluminescent device provided on the substrate and comprising a pixel electrode connected to the common line via the current control thin film transistor, an electroluminescent layer having at least one light emitting layer, and a counter electrode;
   a light-shielding layer for preventing light emitted from the electroluminescent device from reaching the switching and the current control thin film transistors; and
   wherein the light-shielding layer is provided as an insulating film under the pixel electrode and above the switching and current control thin film transistors, and optionally above peripheral regions of the switching and current control thin film transistors.

2. A display device as set forth in claim 1, wherein the light-shielding layer absorbs or reflects light of a specific wavelength emitted from the light emitting layer of the electroluminescent layer.

3. A display device as set forth in claim 1, wherein the light-shielding layer is disposed between active layers constituting the switching and the current control thin film transistors and the EL device to cover the active layers.

4. A display device as set forth in claim 3, wherein at least one of an insulating film, a gate insulating film and an interlayer insulating film is a resin layer, the display device further comprising an inorganic insulating film provided between the resin layer and the switching and the current control thin film transistors or between the resin layer and the substrate.

5. A display device as set forth in claim 3, wherein at least one of an insulating film, a gate insulating film and an interlayer insulating film is a resin layer, the display device further comprising an inorganic insulating film provided between the resin layer and the pixel electrodes.

6. A display device as set forth in claim 1, wherein the light-shielding layer is provided as an interlayer insulating film between the switching and the current control thin film transistors and the electroluminescent layer.

7. A display device as set forth in claim 1, wherein the light-shielding layer is provided as the pixel electrodes.

8. A display device as set forth in claim 1, wherein the light-shielding layer is a black inorganic insulating film.

9. A display device as set forth in claim 1, wherein the light-shielding layer is composed of a resin material containing one of a black pigment and a black dye dispersed therein.

10. A display device as set forth in claim 1, further comprising a second light-shielding layer for preventing external light from reaching the switching and the current control thin film transistors.

11. A display device as set forth in claim 10, wherein the second light-shielding layer is provided below the switching and the current control thin film transistors or below the switching and the current control thin film transistors and peripheral regions thereof.

12. A display device as set forth in claim 1, wherein the substrate is selected from the group consisting of a ceramic substrate coated with an insulating material, a metal substrate coated with an insulating material, and a metal substrate having a surface subjected to an insulating treatment.

13. A method for fabricating a luminescent display device of active matrix drive type as recited in claim 1, wherein the at least one light emitting layer of the electroluminescent layer is formed by a method selected from the group consisting of an evaporation method, a laser transfer method and a printing method.

14. The device of claim 1, wherein the light-shielding layer comprises a gate insulating film which is in contact with a gate of at least one of the transistors.

15. The device of claim 1, wherein the light-shielding layer comprises an interlayer insulating film which is located over and contacting at least part of a gate insulating film, and wherein the light-shielding interlayer insulating film is located below and contacting at least part of the pixel electrode of the electroluminescent element.

16. The device of claim 1, wherein the light-shielding layer contacts an active semiconductor layer of at least one of the transistors.

17. The device of claim 1, wherein the pixel electrode and counter electrode of the electroluminescent element are both located over the insulating light-shielding layer thereby covering at least part of the dielectric light-shielding layer so that the dielectric light-shielding layer is located between the substrate and the electrodes of the electroluminescent element.

18. A luminescent display device of active matrix drive type comprising:
   a substrate;
   a switching thin film transistor, a current control thin film transistor, a capacitor, a signal line, a scanning line and a common line which are supported by at least the substrate;
   an electroluminescent device supported by at least the substrate and comprising a pixel electrode connected to the common line via the current control thin film transistor, an electroluminescent layer having at least one light emitting layer, and a counter electrode;
   a light-shielding layer for preventing light emitted from the electroluminescent device from reaching the switching and the current control thin film transistors;
   wherein the light-shielding layer comprises a gate insulating film of the switching and the current control thin film transistors.

19. A luminescent display device of active matrix drive type comprising:
   a substrate;
   at least one transistor supported by the substrate;
   an electroluminescent device supported by at least the substrate and comprising a pixel electrode, an electroluminescent layer having at least one light emitting layer, and a counter electrode;
   an insulating light-shielding layer for blocking at least some light emitted from the electroluminescent device from reaching the transistor; and
   wherein the pixel electrode and counter electrode of the electroluminescent element are both located over the insulating light-shielding layer thereby covering at least part of the insulating light-shielding layer so that the light-shielding layer is located between the substrate and the electrodes of the electroluminescent element.

20. A luminescent display device of active matrix drive type comprising:

a substrate;

at least one transistor supported by the substrate;

an electroluminescent device supported by at least the substrate and comprising a pixel electrode, an electroluminescent layer having at least one light emitting layer, and a counter electrode;

a light-shielding layer for blocking at least some light emitted from the electroluminescent device from reaching the transistor, wherein the light-shielding layer is at least partially located between the pixel electrode and counter electrode of the electroluminescent element and wherein the light-shielding layer contacts each of the pixel electrode and counter electrode of the electroluminescent element.

21. A luminescent display device of active matrix drive type comprising:

a substrate a switching thin film transistor, a current control thin film transistor, a capacitor, a signal line, a scanning line and a common line which are provided on the substrate;

an electroluminescent device by at least the substrate and comprising a pixel electrode connected to the common line via the current control thin film transistor, an electroluminescent layer having at least one light emitting layer, and a counter electrode;

a light-shielding layer for preventing light emitted from the electroluminescent device from reaching the switching and the current control thin film transistors;

wherein the switching and current control transistors comprise active layers formed directly on the substrate, and wherein the light-shielding layer is formed so as to cover the active layers of said transistors including sidewalls of the active layers which meet and contact the substrate; and wherein the light-shielding layer comprises a gate insulating film which is in contact with a gate of at least one of the transistors.

22. A luminescent display device of active matrix drive type comprising:

a substrate;

a switching thin film transistor, a current control thin film transistor, a capacitor, a signal line, a scanning line and a common line which are provided on the substrate;

an electroluminescent device supported by at least the substrate and comprising a pixel electrode connected to the common line via the current control thin film transistor, an electroluminescent layer having at least one light emitting layer, and a counter electrode;

a light-shielding layer for preventing light emitted from the electroluminescent device from reaching the switching and the current control thin film transistors;

wherein the switching and current control transistors comprise active layers formed directly on the substrate, and wherein the light-shielding layer is formed so as to cover the active layers of said transistors including sidewalls of the active layers which meet and contact the substrate; and wherein the light-shielding layer comprises an interlayer insulating film which is located over and contacting at least part of a gate insulating film, and wherein the light-shielding interlayer insulating film is located below and contacting at least part of the pixel electrode of the electroluminescent element.

23. A luminescent display device of active matrix drive type comprising:

a substrate a switching thin film transistor, a current control thin film transistor, a capacitor, a signal line, a scanning line and a common line which are provided on the substrate;

an electroluminescent device supported by at least the substrate and comprising a pixel electrode connected to the common line via the current control thin film transistor, an electroluminescent layer having at least one light emitting layer, and a counter electrode;

a light-shielding layer for preventing light emitted from the electroluminescent device from reaching the switching and the current control thin film transistors;

wherein the switching and current control transistors comprise active layers formed directly on the substrate, and wherein the light-shielding layer is formed so as to cover the active layers of said transistors including sidewalls of the active layers which meet and contact the substrate; and wherein the light-shielding layer directly contacts the active layers of the transistors including sidewalls thereof.

* * * * *